United States Patent
Kodama et al.

(10) Patent No.: US 8,025,833 B2
(45) Date of Patent: Sep. 27, 2011

(54) CURABLE COMPOSITION FOR NANOIMPRINT, AND PATTERNING METHOD

(75) Inventors: Kunihiko Kodama, Shizuoka (JP); Akinori Fujita, Shizuoka (JP); Tadashi Oomatsu, Kanagawa (JP); Akiyoshi Goto, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 12/472,023

(22) Filed: May 26, 2009

(65) Prior Publication Data

US 2009/0283937 A1 Nov. 19, 2009

Related U.S. Application Data

(63) Continuation-in-part of application No. PCT/JP2009/52139, filed on Feb. 9, 2009.

(30) Foreign Application Priority Data

Feb. 12, 2008 (JP) ................................ 2008-030854
Aug. 12, 2008 (JP) ................................ 2008-207844

(51) Int. Cl.
*B29C 35/08* (2006.01)
*G03F 7/00* (2006.01)

(52) U.S. Cl. ................... 264/496; 430/270.1; 430/280.1; 430/286.1; 522/168; 522/170; 522/175; 522/182; 522/188

(58) Field of Classification Search .................... 522/79, 522/167, 182, 188, 168, 70, 175, 1; 430/20, 430/269, 270.1, 280.1, 286.1; 264/496
See application file for complete search history.

(56) References Cited

U.S. PATENT DOCUMENTS

| | | | |
|---|---|---|---|
| 5,154,994 A | 10/1992 | Yamagishi et al. | |
| 5,231,440 A | 7/1993 | Yamagishi et al. | |
| 5,259,926 A | 11/1993 | Kuwabara et al. | |
| 5,772,905 A | 6/1998 | Chou | |
| 5,956,216 A | 9/1999 | Chou | |
| 7,001,541 B2 * | 2/2006 | Dhar | 264/1.27 |
| 2003/0175615 A1 * | 9/2003 | Miyake et al. | 430/270.1 |
| 2003/0176519 A1 | 9/2003 | Crivello | |
| 2007/0269747 A1 | 11/2007 | Bahadur et al. | |
| 2008/0029933 A1 * | 2/2008 | Higashiizumi et al. | 264/328.1 |
| 2009/0011367 A1 * | 1/2009 | Omatsu et al. | 430/287.1 |
| 2010/0009287 A1 * | 1/2010 | Kodama | 430/270.1 |
| 2010/0133728 A1 * | 6/2010 | Yonezawa et al. | 264/496 |

FOREIGN PATENT DOCUMENTS

| | | |
|---|---|---|
| JP | 62-212401 A | 9/1987 |
| JP | 3-121484 A | 5/1991 |
| JP | 2000-143924 A | 5/2000 |
| JP | 2004-240241 A | 8/2004 |
| JP | 2005-197699 A | 7/2005 |
| JP | 2005-520007 A | 7/2005 |
| JP | 2005-301289 A | 10/2005 |
| JP | 2006-310565 A | 11/2006 |
| JP | 2007-186570 A | 7/2007 |
| JP | 2008-19292 A | 1/2008 |
| JP | 2008-512281 A | 4/2008 |
| JP | 2008-202022 A | 9/2008 |
| WO | 03/076491 A1 | 9/2003 |
| WO | 2006/031455 A2 | 3/2006 |

OTHER PUBLICATIONS

S. Chou, et al., "Imprint of sub-25 nm vias and trenches in polymers", Appl. Phys. Lett. vol. 67, Nov. 20, 1995, pp. 3114-3116.

M. Colburn, et al., "Step and Flash Imprint Lithography: A new Approach to High-Resolution Patterning", SPIE vol. 3676, Mar. 1999, pp. 379-389.

* cited by examiner

*Primary Examiner* — Susan W Berman
(74) *Attorney, Agent, or Firm* — Sughrue Mion, PLLC

(57) ABSTRACT

A curable composition for nanoimprints which comprises a polycyclic aromatic structure-having polymerizable monomer and a photopolymerization initiator is excellent in mold releasability, etching resistance and solvent resistance and capable of forming patterns.

41 Claims, No Drawings

CURABLE COMPOSITION FOR NANOIMPRINT, AND PATTERNING METHOD

CROSS REFERENCE TO RELATED APPLICATIONS

This is a continuation-in-part of International Application No. PCT/JP2009/052139 filed on Feb. 9, 2009. This application also claims benefit of priority of Japanese Application No. 2008-030854 filed on Feb. 12, 2008 and Japanese Application No. 2008-207844 filed on Aug. 12, 2008.

BACKGROUND OF THE INVENTION

1. Field of the Invention

The present invention relates to a curable composition for nanoimprints. More precisely, the invention relates to a curable composition for micropatterning through photoirradiation to give nanoimprints, which is used in producing magnetic recording media such as semiconductor integrated circuits, flat screens, microelectromechanical systems (MEMS), sensor devices, optical discs, high-density memory discs, etc.; optical members such as gratings, relief holograms, etc.; optical films for production of nanodevices, optical devices, flat panel displays, etc.; polarizing elements, thin-film transistors in liquid-crystal displays, organic transistors, color filters, overcoat layers, pillar materials, rib materials for liquid-crystal alignment, microlens arrays, immunoassay chips, DNA separation chips, microreactors, nanobio devices, optical waveguides, optical filters, photonic liquid crystals, etc.

2. Description of the Related Art

Nanoimprint technology is a development advanced from embossing technology well known in the art of optical disc production, which comprises pressing a mold original with an embossed pattern formed on its surface (this is generally referred to as "mold", "stamper" or "template") against a resin to thereby accurately transfer the micropattern onto the resin through mechanical deformation of the resin. In this, when a mold is once prepared, then microstructures such as nanostructures can be repeatedly molded, and therefore, this is economical, and in addition, harmful wastes and discharges from this nanotechnology are reduced. Accordingly these days, this is expected to be applicable to various technical fields.

Two methods of nanoimprint technology have been proposed; one is a thermal nanoimprint method using a thermoplastic resin as the material to be worked (for example, see S. Chou, et al., Appl. Phys. Lett. Vol. 67, 3114 (1995)), and the other is a photonanoimprint method using a photocurable composition (for example, see M. Colbun, et al., Proc. SPIE, Vol. 3676, 379 (1999)). In the thermal nanoimprint method, a mold is pressed against a polymer resin heated up to a temperature not lower than the glass transition temperature thereof, then the resin is cooled and thereafter released from the mold to thereby transfer the microstructure of the mold onto the resin on a substrate. The method is applicable to various resin materials and glass materials and is expected to be applicable to various fields. For example, U.S. Pat. Nos. 5,772,905 and 5,956,216 disclose a nanoimprint method of forming nanopatterns inexpensively.

On the other hand, in the photonanoimprint method where a curable composition for photonanoimprints is photocured by photoirradiation through a transparent mold or a transparent substrate, the transferring material does not require heating in pressing it against the mold, and therefore the method enables room-temperature imprinting. Recently, new developments having the advantages of the above two as combined, have been reported, including a nanocasting method and a reversal imprint method for forming three-dimensional structures.

For the nanoimprint methods as above, proposed are applied technologies mentioned below.

In the first technology, the molded pattern itself has a function, and is applied to various elements in nanotechnology and to structural members. Its examples include various micro/nano optical elements and high-density recording media, as well as structural members in optical films, flat panel displays, etc. The second technology is for hybrid-molding of microstructures and nanostructures, or for construction of laminate structures through simple interlayer positioning, and this is applied to production of µ-TAS (micro-total analysis system) and biochips. In the third technology, the formed pattern is used as a mask and is applied to a method of processing a substrate through etching or the like. In these technologies, high-precision positioning is combined with high-density integration; and in place of conventional lithography technology, these technologies are being applied to production of high-density semiconductor integrated circuits and transistors in liquid-crystal displays, and also to magnetic processing for next-generation hard discs referred to as patterned media. Recently, the action on industrialization of the above-mentioned nanoimprint technologies and their applied technologies has become active for practical use thereof.

As one example of nanoimprint technology, hereinunder described is an application to production of high-density semiconductor integrated circuits. The recent development in micropatterning and integration scale enlargement in semiconductor integrated circuits is remarkable, and high-definition photolithography for pattern transfer for realizing the intended micropatterning is being much promoted and advanced in the art. However, for further requirement for more definite micropatterning to a higher level, it is now difficult to satisfy all the three of micropattern resolution, cost reduction and throughput increase. Regarding this, as a technology of micropatterning capable of attaining at a low cost, nanoimprint lithography (photonanoimprint method) is proposed. For example, U.S. Pat. Nos. 5,772,905 and 5,259,926 disclose a nanoimprint technology of using a silicon wafer as a stamper for transferring a microstructure of at most 25 nm. This application requires micropatternability on a level of a few tens nm and high-level etching resistance of the micropattern functioning as a mask in substrate processing.

An application example of nanoimprint technology to production of next-generation hard disc drives (HDD) is described. Based on head performance improvement and media performance improvement closely connected with each other, the course of HDD history is for capacity increase and size reduction. From the viewpoint of media performance improvement, HDD has realized increased large-scale capacity as a result of the increase in the surface-recording density thereon. However, in increasing the recording density, there occurs a problem of so-called magnetic field expansion from the side surface of the magnetic head. The magnetic field expansion could not be reduced more than a certain level even though the size of the head is reduced, therefore causing a phenomenon of so-called sidelight. The sidelight, if any, causes erroneous writing on the adjacent tracks and may erase the already recorded data. In addition, owing to the magnetic field expansion, there may occur another problem in that superfluous signals may be read from the adjacent track in reproduction. To solve these problems, there are proposed technologies of discrete track media and bit patterned media of filling the distance between the adjacent tracks with a non-magnetic material to thereby physically and magnetically separate the tracks. As a method of forming the magnetic or non-magnetic pattern in production of these media, application of nanoimprint technology is proposed. The application also requires micropatternability on a level of a few tens nm and high-level etching resistance of the micropattern functioning as a mask in substrate processing.

Next described is an application example of nanoimprint technology to flat displays such as liquid-crystal displays (LCD) and plasma display panels (PDP).

With the recent tendency toward large-sized LCD substrates and PDP substrates for high-definition microprocessing thereon, photonanoimprint lithography has become specifically noted these days as an inexpensive lithography technology capable of being substituted for conventional photolithography for use in production of thin-film transistors (TFT) and electrode plates. Accordingly, it has become necessary to develop a photocurable resist capable of being substituted for the etching photoresist for use in conventional photolithography.

Further, for the structural members for LCD and others, application of photonanoimprint technology to transparent protective film materials described in JP-A-2005-197699 and 2005-301289, or to spacers described in JP-A-2005-301289 is being under investigation. Differing from the above-mentioned etching resist, the resist for such structural members finally remains in displays, and therefore, it may be referred to as "permanent resist" or "permanent film".

The spacer to define the cell gap in liquid-crystal displays is also a type of the permanent film; and in conventional photolithography, a photocurable composition comprising a resin, a photopolymerizable monomer and an initiator has been generally widely used for it (for example, see JP-A-2004-240241). In general, the spacer is formed as follows: After a color filter is formed on a color filter substrate, or after a protective film for the color filter is formed, a photocurable composition is applied thereto, and a pattern having a size of from 10 µm or 20 µm or so is formed through photolithography, and this is further thermally cured through past-baking to form the intended spacer.

Further, nanoimprint lithography is useful also in formation of permanent films in optical members such as microelectromechanical systems (MEMS), sensor devices, gratings, relief holograms, etc.; optical films for production of nanodevices, optical devices, flat panel displays, etc.; polarizing elements, thin-film transistors in liquid-crystal displays, organic transistors, color filters, overcoat layers, pillar materials, rib materials for liquid-crystal alignment, microlens arrays, immunoassay chips, DNA separation chips, microreactors, nanobio devices, optical waveguides, optical filters, photonic liquid crystals, etc.

In application to such permanent films, the formed pattern remains in the final products, and is therefore required to have high-level properties of mainly film durability and strength, including heat resistance, light resistance, solvent resistance, scratch resistance, high-level mechanical resistance to external pressure, hardness, etc.

Almost all patterns heretofore formed in conventional photolithography can be formed in nanoimprint technology, which is therefore specifically noted as a technology capable of forming micropatterns inexpensively.

On the assumption that good patterns are formed in such application, another important parameter in nanoimprint technology for micropatterning is the peelability of the curable composition for nanoimprints from molds. Different from photolithography in which a photosensitive composition is not kept in contact with a mask, a curable composition for nanoimprints is kept in contact with the mold in nanoimprint technology. In peeling from the mold, when the residue of the composition remains on the mold, there occurs a problem in that the residue may form pattern failures in the subsequent imprinting procedure. For solving the problem, some trials have heretofore been taken for mold surface treatment. Concretely, a method of bonding a fluoroalkyl chain-containing silane coupling agent to a mold surface, or a method of using a fluorine/plasma-processed mold or a fluorine-containing resin mold has been tried for solving the residue deposition problem. However, in industrial-scale mass production, the mold to be used is required to be resistant to tens of thousands of times of imprinting repetition; and not only the mold surface treatment but also the mold releasability improvement of the curable compositions for nanoimprints is required.

JP-A-2000-143924 discloses a patterning method of using a fluorine-containing curable material for enhancing the mold releasability of the formed pattern. JP-A-2007-186570 discloses a photocurable resin composition for nanoimprints, which contains a cyclic structure-having (meth)acrylate monomer for imparting dry etchability thereto.

In industrial use of nanoimprint technology, the patternability of the curable composition for nanoimprints, especially the mold releasability thereof is extremely important, as described in the above. Further, the curable composition for nanoimprints is required to have other film properties such as etching resistance and pattern durability depending on its use. However, in the patterning method proposed in JP-A-2000-143924, the fluorine-containing material is problematic in that it is poorly resistant to etching, and the pattern is greatly worsened during etching. The photocurable resin composition proposed in JP-A-2007-186570 is also unsatisfactory in point of the patternability and the solvent resistance thereof; and in the prior arts, the curable resins for nanoimprints could hardly satisfy both good patternability and good film properties.

SUMMARY OF THE INVENTION

An object of the invention is to provide a curable composition for nanoimprints in nanoimprint lithography, which is excellent not only in photocurability but also nanometer-level micropatternability and especially mold releasability, and which satisfies high-level etching durability enough for substrate processing, and high-level solvent resistance enough for permanent films, and to provide a patterning method of using the curable composition.

The invention includes the following:

[1] A curable composition for nanoimprints, comprising a polycyclic aromatic structure-having polymerizable monomer (Ax) and a photopolymerization initiator (B).
[2] The curable composition for nanoimprints of [1], wherein the polycyclic aromatic structure of the polymerizable monomer (Ax) is a hydrocarbon-type polycyclic aromatic structure.
[3] The curable composition for nanoimprints of [1] or [2], wherein the polycyclic aromatic structure of the polymerizable monomer (Ax) is a naphthalene structure.
[4] The curable composition for nanoimprints of any one of [1] to [3], wherein the polymerizable monomer (Ax) contains a radical-polymerizable functional group.

[5] The curable composition for nanoimprints of any one of [1] to [4], wherein the polymerizable monomer (Ax) contains at least one selected from a (meth)acrylic group, a vinyl group and an allyl group.

[6] The curable composition for nanoimprints of any one of [1] to [5], wherein the polymerizable monomer (Ax) is a compound represented by the following formula (I):

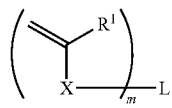

wherein $R^1$ represents a hydrogen atom, an alkyl group optionally having a substituent, or a halogen atom; X represents a single bond, or an organic linking group; L represents an m-valent polycyclic aromatic group optionally having a substituent; and m indicates an integer of from 1 to 3.

[7] The curable composition for nanoimprints of any one of [1] to [6], wherein the polymerizable monomer (Ax) is a compound represented by the following formula (IA):

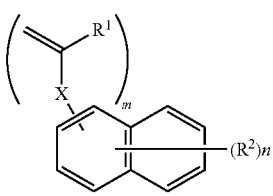

wherein $R^1$ represents a hydrogen atom, an alkyl group optionally having a substituent, or a halogen atom; X represents a single bond, or an organic linking group; m indicates an integer of from 1 to 3; $R^2$ represents an organic substituent; and n indicates an integer of from 0 to 6.

[8] The curable composition for nanoimprints of any one of [1] to [7], wherein the polymerizable monomer (Ax) is at least one of the following formula (IC) or (ID):

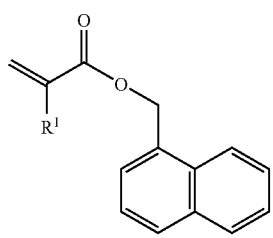

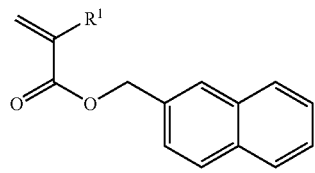

wherein $R^1$ represents a hydrogen atom, an alkyl group optionally having a substituent, or a halogen atom.

[9] The curable composition for nanoimprints of any one of [1] to [8], which further comprises any other polymerizable monomer different from the polymerizable monomer (Ax).

[10] The curable composition for nanoimprints of any one of [1] to [9], which comprises a polymer ingredient having a molecular weight of at least 2000 in an amount of at most 30% by mass, relative to the whole weight of the ingredients constituting the composition except solvents.

[11] The curable composition for nanoimprints of any one of [1] to [10], which further comprises at least one selected from a fluorine-containing surfactant, silicone-type surfactant, a fluorine-containing silicone-type surfactant and an antioxidant.

[12] The curable composition for nanoimprints of any one of [1] to [11], which further comprises at least one solvent selected from the group consisting of propylene glycol monomethyl ether acetate, cyclohexanone, 2-heptanone, gamma-butyrolactone, propylene glycol monomethyl ether, and ethyl lactate.

[13] A patterning method comprising applying a curable composition for nanoimprints of any one of [1] to [12] onto a substrate to form a patterning layer thereon, pressing a mold against the surface of the patterning layer, and irradiating the patterning layer with light.

According to the invention, there is provided a curable composition for nanoimprints, which is excellent in mold releasability, etching resistance and solvent resistance and capable of forming patterns. According to the patterning method of the invention of using the curable composition for nanoimprints of the invention, there is provided a pattern excellent in mold releasability, etching resistance and solvent resistance.

BEST MODE FOR CARRYING OUT THE INVENTION

The contents of the invention are described in detail hereinunder. In this description, the numerical range expressed by the wording "a number to another number" means the range that falls between the former number indicating the lowermost limit of the range and the latter number indicating the uppermost limit thereof.

In this description, "(meth)acrylate" means acrylate and methacrylate; "(meth)acrylic" means acrylic and methacrylic; "(meth)acryloyl" means acryloyl and methacryloyl. In the invention, monomer is differentiated from oligomer and polymer, and the monomer indicates a compound having a weight-average molecular weight of at most 1,000. In this description, "functional group" means a group participating in polymerization. "Nanoimprint" referred to in the invention is meant to indicate pattern transfer in a size of from a few nm to a few μm.

Regarding the expression of "group (atomic group)" in this description, the expression with no indication of "substituted" or "unsubstituted" includes both "substituted group" and "unsubstituted group". For example, "alkyl group" includes not only an alkyl group not having a substituent (unsubstituted alkyl group) but also an alkyl group having a substituent (substituted alkyl group).

[Curable Composition for Nanoimprints of the Invention]

The curable composition for nanoimprints of the invention (this may be hereinafter simply referred to as "composition of the invention") comprises at least a polycyclic aromatic structure-having polymerizable monomer (Ax) and a photopolymerization initiator (B). In general, the curable composition for use in photonanoimprint technology comprises a polymerizable monomer having a polymerizable functional group, and a photopolymerization initiator that initiates polymerization of the polymerizable monomer through photoirradiation, and optionally contains a solvent, a surfactant, an antioxidant, etc. The curable composition for nanoimprints of the invention contains, as the polymerizable monomer having a polymerizable functional group (hereinafter the polymerizable monomer that the composition of the invention contains may be referred to as a generic term "photopolymerizable monomer (A)"), at least the above-mentioned polymerizable monomer (Ax). The curable composition for nanoimprints of the invention contains the polycyclic aromatic structure-having polymerizable monomer (Ax), and is therefore capable of forming patterns excellent in mold releasability, etching resistance and solvent resistance.

(Polymerizable Monomer)

—Polymerizable Monomer (Ax)—

The polymerizable monomer (Ax) in the invention is a compound having a polymerizable functional group. The polymerizable functional group includes a cationic-polymerizable functional group and a radical-polymerizable functional group; and the radical-polymerizable functional group is preferred. As the cationic-polymerizable functional group, preferred are an epoxy group and an oxetane group. The radical-polymerizable functional group includes an ethylenic unsaturated bond-having functional group; and a (meth)acrylic group, a vinyl group and an allyl group are preferred. The number of the polymerizable functional groups that the polymerizable monomer (Ax) in the invention may contain is preferably from 1 to 4 from the viewpoint of the curability and the viscosity of the composition, more preferably from 1 to 2.

The polymerizable monomer (Ax) in the invention has a polycyclic aromatic structure, or that is, a condensed polycyclic aromatic structure where at least two cyclic structures are condensed. Accordingly, the polycyclic aromatic structure does not include a ring-connected structure where two or more simple aromatic rings are connected to each other via a single bond or an organic linking group therebetween, such as bisphenol or the like. In the invention, the "polycyclic aromatic" structure includes not only a complete aromatic structure where all the condensed rings are aromatic rings such as naphthalene or the like but also an aromatic/non-aromatic condensed structure, for example, a 1,2,3,4-tetrahydronaphthalene structure where benzene and cyclohexane are condensed, etc. The polycyclic aromatic structure in the invention is preferably a bicyclic to tetracyclic condensed ring structure, more preferably a bicyclic or tricyclic condensed ring structure, even more preferably a bicyclic condensed ring structure. A curable composition for nanoimprints not containing a polycyclic aromatic structure-having polymerizable monomer, in which, in other words, all the polymerizable compounds are compounds having at most a monocyclic aromatic structure is unfavorable since the patterns are significantly deteriorated during dry etching (or that is, the dry etching resistance of the patterns is low), and the solvent resistance in development of the patterns is not satisfactory, and in addition, the releasability of the patterns from mold is poor; and accordingly, the composition could not satisfy all these properties on a sufficiently high level. Contrary to this, the curable composition for nanoimprints of the invention secures good releasability from mold especially in forming patterns on a nanometer order.

The polycyclic aromatic structure of the polymerizable monomer (Ax) in the invention includes a hydrocarbon-type polycyclic aromatic structure such as naphthalene, anthracene, phenanthrene, pyrene, 1,2,3,4-tetrahydronaphthalene, etc., but also a heterocyclic polycyclic aromatic structure such as indole, carbazole, quinoline, benzisoquinoline, etc. As the polycyclic aromatic structure in the invention, preferred is the hydrocarbon-type polycyclic aromatic structure, and more preferred are a naphthalene structure and an anthracene structure, and even more preferred is a naphthalene structure.

The number of carbon atoms constituting the polymerizable monomer (Ax) in the invention is preferably from 10 to 20 from the viewpoint of the viscosity and the solvent resistance of the composition, more preferably from 11 to 16. The molecular weight of the polymerizable monomer (Ax) is preferably from 150 to 400 from the viewpoint of the viscosity and the solvent resistance of the composition, more preferably from 150 to 300, even more preferably from 190 to 300.

The polycyclic aromatic structure-having polymerizable monomer (Ax) is preferably a compound represented by the following formula (I):

wherein $R^1$ represents a hydrogen atom, an alkyl group optionally having a substituent, or a halogen atom; X represents a single bond, or an organic linking group; L represents an m-valent polycyclic aromatic group optionally having a substituent; m indicates an integer of from 1 to 3.

In formula (I), $R^1$ represents a hydrogen atom, an alkyl group optionally having a substituent, or a halogen atom. The alkyl group optionally having a substituent is preferably an alkyl group having from 1 to 4 carbon atoms from the viewpoint of the curability of the composition, more preferably an alkyl group having from 1 to 3 carbon atoms. The alkyl group is preferably a methyl group, an ethyl group or a propyl group, more preferably a methyl group. The substituent that the alkyl group may have is preferably a halogen atom, a hydroxyl group, an alkoxy group, an acyloxy group.

The halogen atom for $R^1$ and for the substituent of the alkyl group includes fluorine, chlorine, bromine and iodine atoms, and is preferably a fluorine atom.

In formula (I), X represents a single bond or an organic linking group. The organic linking group is preferably —O—, —C(=O)O—, —C(=O)NRx- (where Rx means a hydrogen atom or an organic group, and the organic group is preferably an aryl group or an alkyl group), an alkylene group, or a linking group of two or more such groups as combined, more preferably —C(=O)O—, or —C(=O)O-alkylene-.

In formula (I), m indicates an integer of from 1 to 3, and is preferably 1 or 2 from the viewpoint of the viscosity and the curability of the composition. When m is 2 or more, the plural X's and $R^1$'s existing in the formula may be the same or different.

In formula (I), L represents an m-valent polycyclic aromatic group optionally having a substituent. The polycyclic aromatic group means a group having the above-mentioned polycyclic aromatic structure, and is preferably a group having a naphthalene structure. The substituent for L includes an alkyl group, an aryl group, a halogen atom, an acyloxy group, an alkoxycarbonyl group, a nitro group, a cyano group, etc.

The polycyclic aromatic structure-having polymerizable monomer (Ax) in the invention is more preferably a compound represented by the following formula (IA):

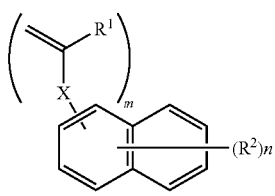

(IA)

wherein $R^1$ represents a hydrogen atom, an alkyl group optionally having a substituent, or a halogen atom; X represents a single bond, or an organic linking group; m indicates an integer of from 1 to 3; $R^2$ represents an organic substituent; n indicates an integer of from 0 to 6.

$R^1$, X and m in formula (IA) have the same meanings as those in the above-mentioned formula (I), and their preferred ranges are also the same as those in the above. When m is 2 or more, the plural X's and $R^1$'s existing in the formula may be the same or different.

In formula (IA), $R^2$ represents an organic substituent. The organic substituent is preferably an alkyl group, an aryl group, a halogen atom, an acyloxy group, an alkoxycarbonyl group, a nitro group, a cyano group, an alkoxy group.

In formula (IA), n indicates an integer of from 0 to 6, and is preferably from 0 to 3. When n is 2 or more, the plural $R^2$'s existing in the formula may be the same or different. The compound of formula (IA) preferably includes naphthalene structure-having (meth)acrylates or naphthalene structure-having acrylamides, and is more preferably a compound of a formula (IB):

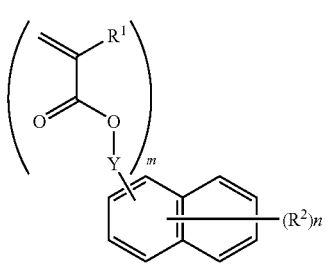

(IB)

In formula (IB), Y represents a single bond, or an alkylene group optionally having a hetero atom in the chain. The alkylene group includes, for example, a methylene group, an ethylene group, —(CH$_2$CH$_2$O)—, and is preferably a methylene group. Y is preferably a single bond or a methylene group from the viewpoint of the etching resistance and the solvent resistance of the composition. When m is 2 or more, the plural Y's and $R^1$'s existing in the formula may be the same or different. $R^1$ and m in formula (IB) have the same meanings as those in the above-mentioned formula (I), and their preferred ranges are also the same as those in the above. $R^2$ and n in formula (IB) have the same meanings as those in the above-mentioned formula (IA), and their preferred ranges are also the same as those in the above.

More preferably, the polymerizable monomer (Ax) is a compound of the following formula (IC) or (ID), since the compound is excellent in miscibility with the other ingredients and since the composition can be readily charged in mold. When the mold chargeability thereof is bettered, then the curable composition may be smoothly charged in a mold even though the mold-pressing pressure is not increased in industrial-scale patterning, and therefore the composition is more preferable from the viewpoint of the mold durability and the throughput in patterning.

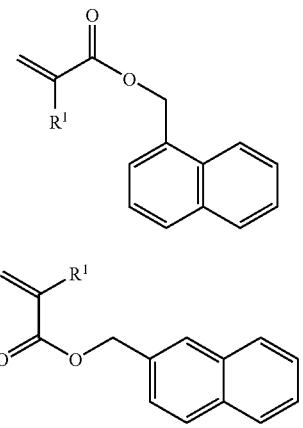

In formulae (IC) and (ID), $R^1$ has the same meaning as that in the above-mentioned formula (IA), and its preferred range is also the same as in the above.

Specific examples (Compounds (I-1) to (I-29)) of the polymerizable monomer (Ax) in the invention are shown below.

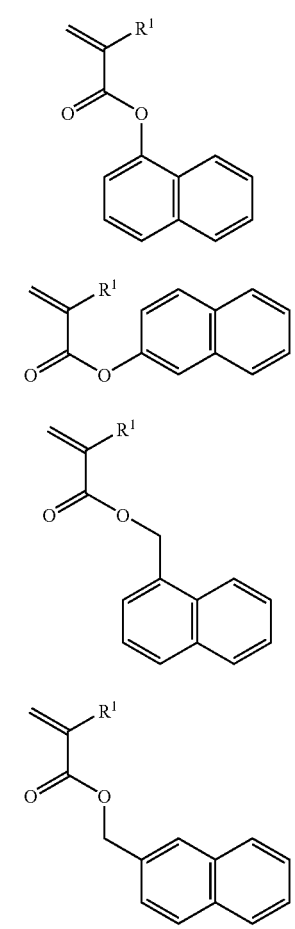

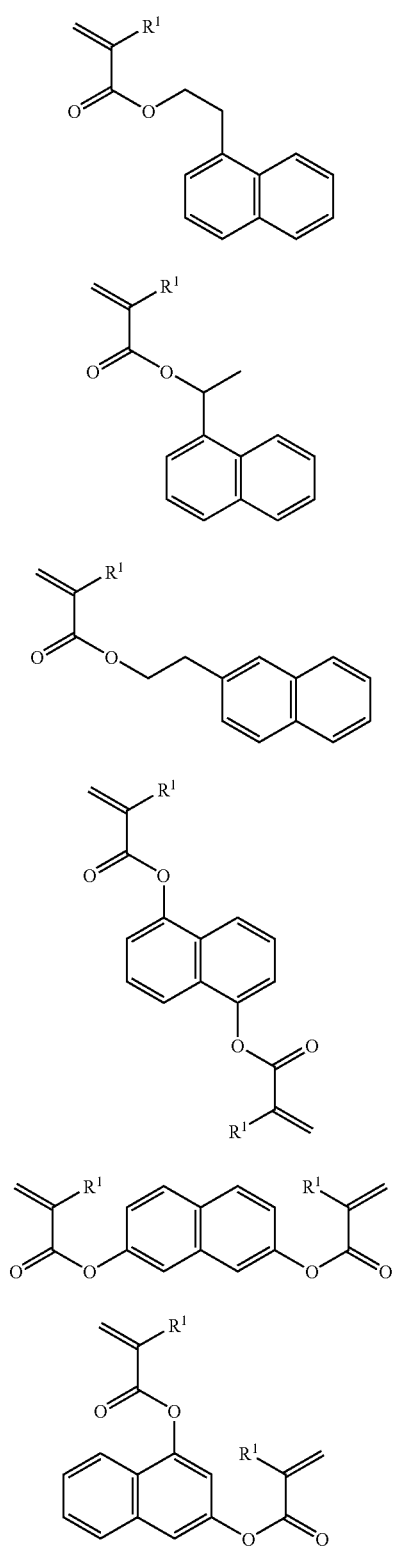
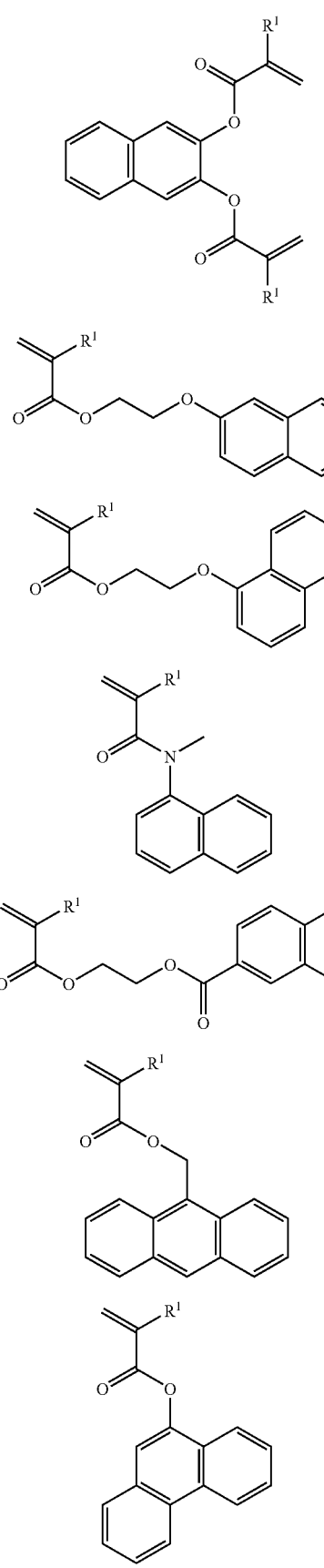

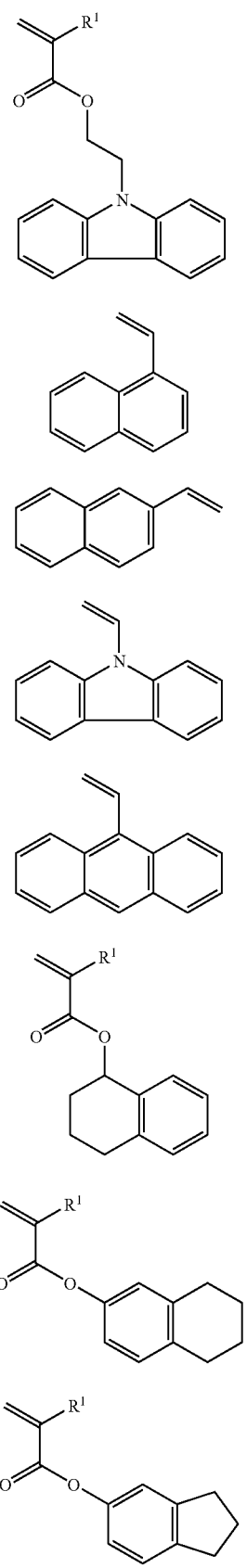
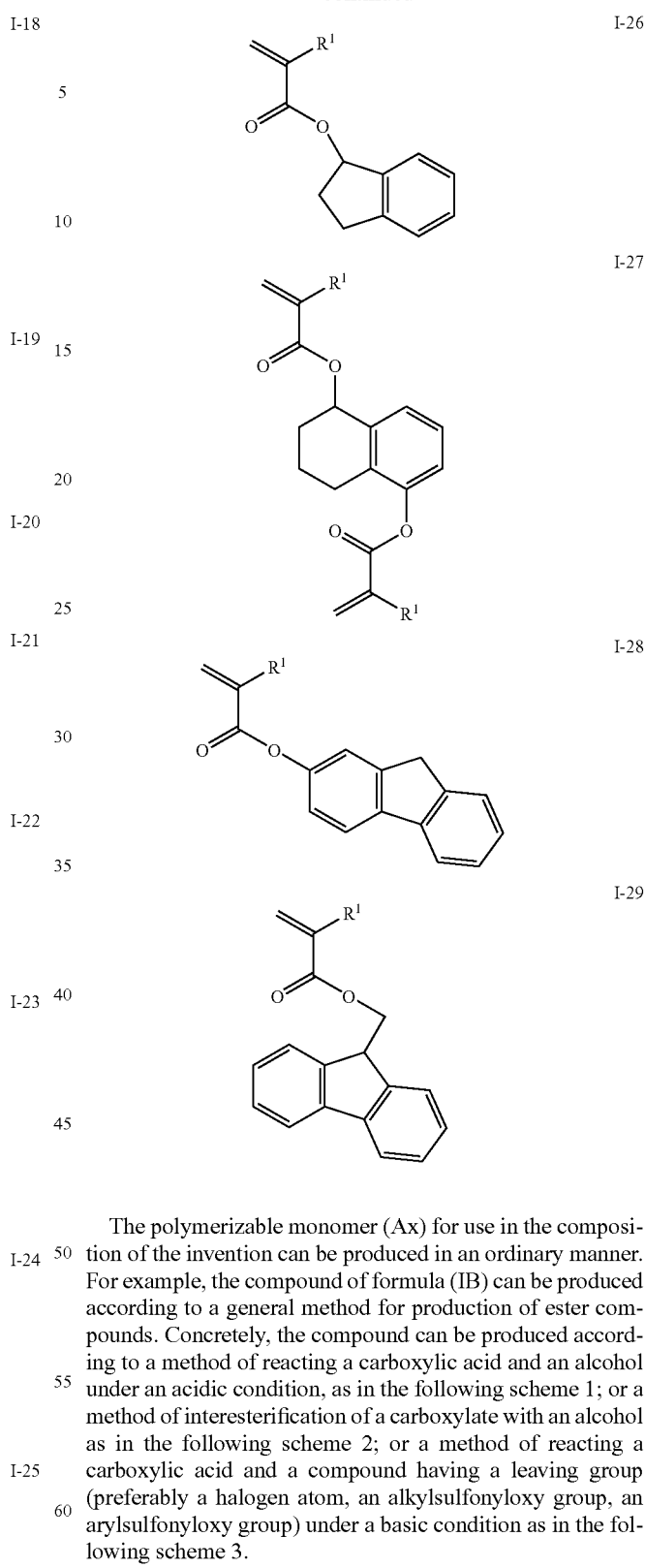

The polymerizable monomer (Ax) for use in the composition of the invention can be produced in an ordinary manner. For example, the compound of formula (IB) can be produced according to a general method for production of ester compounds. Concretely, the compound can be produced according to a method of reacting a carboxylic acid and an alcohol under an acidic condition, as in the following scheme 1; or a method of interesterification of a carboxylate with an alcohol as in the following scheme 2; or a method of reacting a carboxylic acid and a compound having a leaving group (preferably a halogen atom, an alkylsulfonyloxy group, an arylsulfonyloxy group) under a basic condition as in the following scheme 3.

Scheme 1

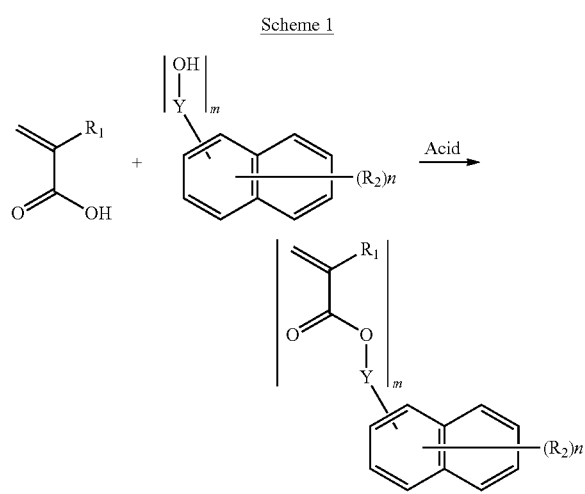

Scheme 4

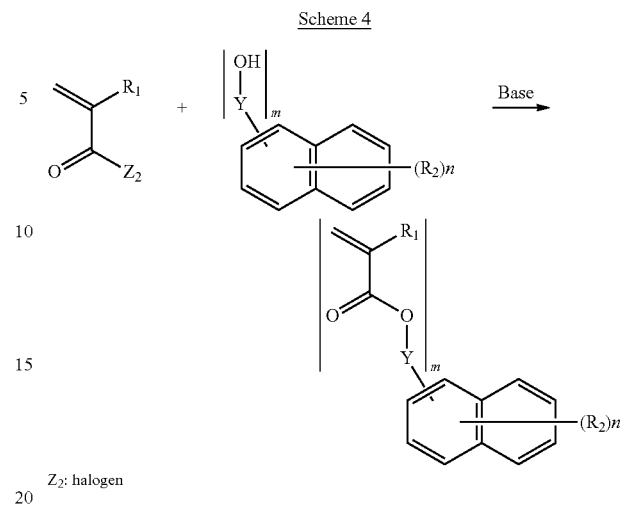

$Z_2$: halogen

Scheme 2

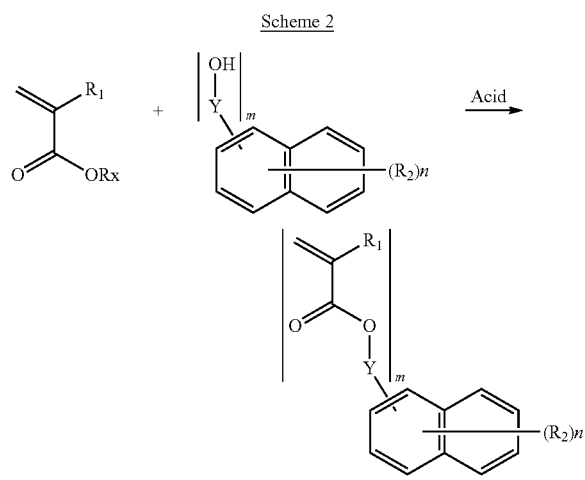

Rx: alkyl group

Scheme 3

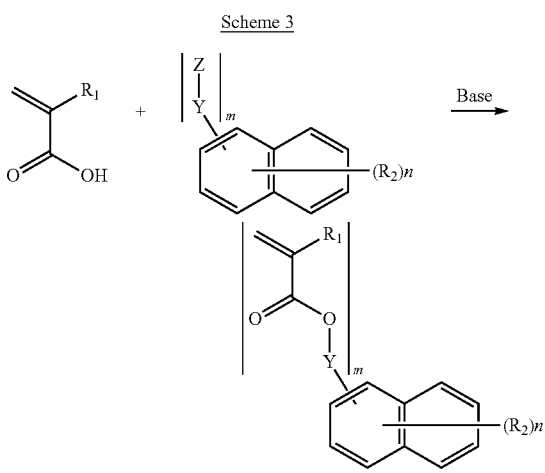

Z: leaving group

The total content of the polymerizable monomers in the curable composition for nanoimprints of the invention is preferably from 50 to 99.5% by mass of all the constitutive ingredients except solvent from the viewpoint of the curability of the composition, more preferably from 70 to 99% by mass, even more preferably from 90 to 99% by mass. When the polymerizable monomer (Ax) is a compound having one polymerizable functional group, then the content of the polymerizable monomer (Ax) in the invention is preferably from 5 to 100% by mass of all the polymerizable monomers from the viewpoint of the dry etching resistance, the solvent resistance and the patternability of the composition, more preferably from 20 to 100% by mass, even more preferably from 30 to 100% by mass. When the polymerizable monomer (Ax) is a compound having two polymerizable functional groups, then the content of the polymerizable monomer (Ax) in the invention is preferably from 1 to 70% by mass of all the polymerizable monomers, more preferably from 5 to 60% by mass, even more preferably from 10 to 40% by mass. When the polymerizable monomer (Ax) is a compound having 3 or more polymerizable functional groups, then the content of the polymerizable monomer (Ax) in the invention is preferably from 1 to 70% by mass of all the polymerizable monomers, more preferably from 3 to 50% by mass, even more preferably from 5 to 40% by mass. Specifically, from the viewpoint of controlling the composition viscosity and enhancing the dry etching resistance, the imprint aptitude and the curability of the composition, the polymerizable monomer (Ax) having at least two polymerizable functional groups in the composition of the invention is preferably combined with any other polymerizable monomer different from the polymerizable monomer (Ax). The additional polymerizable monomer is described below.

Other Polymerizable Monomer

As described in the above, the curable composition for nanoimprints of the invention may further contain any other polymerizable monomer different from the polymerizable monomer (Ax) for the purpose of suitably controlling the composition viscosity and of further enhancing the dry etching resistance, the imprint aptitude and the curability of the composition. The other polymerizable monomer includes, for example, a polymerizable unsaturated monomer having from 1 to 6 ethylenic unsaturated bond-having groups, a compound having an oxirane ring (epoxy compound), a vinyl ether compound, a styrene derivative, a fluorine atom-having compound, propenyl ether, butenyl ether, etc. From the viewpoint of the curability of the composition, preferred is a polymerizable unsaturated monomer having from 1 to 6 ethylenic unsaturated bond-having groups.

The polymerizable unsaturated monomer having from 1 to 6 ethylenic unsaturated bond-having groups (mono- to hexafunctional polymerizable unsaturated monomer) is described below.

The polymerizable unsaturated monomer having one ethylenic unsaturated bond-having group (mono-functional polymerizable unsaturated monomer) includes concretely 2-acryloyloxyethyl phthalate, 2-acryloyloxy-2-hydroxyethyl phthalate, 2-acryloyloxyethyl hexahydrophthalate, 2-acryloyloxypropyl phthalate, 2-ethyl-2-butylpropanediol acrylate, 2-ethylhexyl(meth)acrylate, 2-ethylhexylcarbitol (meth)acrylate, 2-hydroxybutyl(meth)acrylate, 2-hydroxyethyl(meth)acrylate, 2-hydroxypropyl(meth)acrylate, 2-methoxyethyl(meth)acrylate, 3-methoxybutyl (meth)acrylate, 4-hydroxybutyl(meth)acrylate, acrylic acid dimer, benzyl(meth)acrylate, butanediol mono(meth)acrylate, butoxyethyl(meth)acrylate, butyl(meth)acrylate, cetyl (meth)acrylate, ethyleneoxide-modified (hereinafter this may be referred to as "EO") cresol(meth)acrylate, dipropylene glycol (meth)acrylate, ethoxylated phenyl (meth)acrylate, ethyl (meth)acrylate, isoamyl (meth)acrylate, isobutyl(meth)acrylate, isooctyl (meth)acrylate, cyclohexyl(meth)acrylate, isobornyl (meth)acrylate, dicyclopentanyl(meth)acrylate, dicyclopentenyloxyethyl(meth)acrylate, isomyristyl (meth)acrylate, lauryl(meth)acrylate, methoxydiproylene glycol (meth)acrylate, methoxytripropylene glycol (meth)acrylate, methoxypolyethylene glycol(meth)acrylate, methoxytriethylene glycol(meth)acrylate, methyl (meth)acrylate, neopentyl glycol benzoate (meth)acrylate, nonylphenoxypolyethylene glycol(meth)acrylate, nonylphenoxypolypropylene glycol(meth)acrylate, octyl (meth)acrylate, paracumylphenoxyethylene glycol (meth)acrylate, epichlorohydrin (hereinafter referred to as "ECH")-modified phenoxyacrylate, phenoxyethyl (meth)acrylate, phenoxydiethylene glycol (meth)acrylate, phenoxyhexaethylene glycol(meth)acrylate, phenoxytetraethylene glycol(meth)acrylate, polyethylene glycol(meth)acrylate, polyethylene glycol-polypropylene glycol(meth)acrylate, polypropylene glycol(meth)acrylate, stearyl(meth)acrylate, EO-modified succinic acid (meth)acrylate, tert-butyl(meth)acrylate, tribromophenyl (meth)acrylate, EO-modified tribromophenyl(meth)acrylate, tridodecyl(meth)acrylate, p-isopropenylphenyl, styrene, α-methylstyrene, acrylonitrile.

Of those, especially preferred for use in the invention are benzyl(meth)acrylate, dicyclopentanyl (meth)acrylate, dicyclopentenyloxyethyl(meth)acrylate, isobornyl(meth)acrylate, adamantyl(meth)acrylate.

As the other polymerizable monomer, also preferred is a polyfunctional polymerizable unsaturated monomer having two ethylenic unsaturated bond-containing groups.

Preferred examples of the difunctional polymerizable unsaturated monomer having two ethylenic unsaturated bond-containing groups for use in the invention include diethylene glycol monoethyl ether (meth)acrylate, dimethylol-dicyclopentane di(meth)acrylate, di(meth)acrylated isocyanurate, 1,3-butylene glycol di(meth)acrylate, 1,4-butanediol di(meth)acrylate, EO-modified 1,6-hexanediol di(meth)acrylate, ECH-modified 1,6-hexanediol di(meth)acrylate, allyloxy-polyethylene glycol acrylate, 1,9-nonanediol di(meth)acrylate, EO-modified bisphenol A di(meth)acrylate, PO-modified bisphenol A di(meth)acrylate, modified bisphenol A di(meth)acrylate, EO-modified bisphenol F di(meth)acrylate, ECH-modified hexahydrophthalic acid diacrylate, hydroxypivalic acid neopentyl glycol di(meth)acrylate, neopentyl glycol di(meth)acrylate, EO-modified neopentyl glycol diacrylate, propyleneoxide (hereinafter referred to as "PO")-modified neopentyl glycol diacrylate, caprolactone-modified hydroxypivalate neopentyl glycol, stearic acid-modified pentaerythritol di(meth)acrylate, ECH-modified phthalic acid di(meth)acrylate, poly(ethylene glycol-tetramethylene glycol) di(meth)acrylate, poly(propylene glycol-tetramethylene glycol) di(meth)acrylate, polyester (di)acrylate, polyethylene glycol di(meth)acrylate, polypropylene glycol di(meth)acrylate, ECH-modified propylene glycol di(meth)acrylate, silicone di(meth)acrylate, triethylene glycol di(meth)acrylate, tetraethylene glycol di(meth)acrylate, dimethyloltricyclodecane di(meth)acrylate, neopentyl glycol-modified trimethylolpropane di(meth)acrylate, tripropylene glycol di(meth)acrylate, EO-modified tripropylene glycol di(meth)acrylate, triglyceryl di(meth)acrylate, dipropylene glycol di(meth)acrylate, divinylethylene-urea, divinylpropylene-urea.

Of those, especially preferred for use in the invention are neopentyl glycol di(meth)acrylate, 1,9-nonanediol di(meth)acrylate, tripropylene glycol di(meth)acrylate, tetraethylene glycol di(meth)acrylate, hydroxypivalate neopentyl glycol di(meth)acrylate, polyethylene glycol di(meth)acrylate, etc.

Examples of the polyfunctional polymerizable unsaturated monomer having at least three ethylenic unsaturated bond-having groups include ECH-modified glycerol tri(meth)acrylate, EO-modified glycerol tri(meth)acrylate, PO-modified glycerol tri(meth)acrylate, pentaerythritol triacrylate, EO-modified phosphoric acid triacrylate, trimethylolpropane tri(meth)acrylate, caprolactone-modified trimethylolpropane tri(meth)acrylate, EO-modified trimethylolpropane tri(meth)acrylate, PO-modified trimethylolpropane tri(meth)acrylate, tris(acyloxyethyl) isocyanurate, dipentaerythritol hexa(meth)acrylate, caprolactone-modified dipentaerythritol hexa(meth)acrylate, dipentaerythritol hydroxy-penta(meth)acrylate, alkyl-modified dipentaerythritol penta(meth)acrylate, dipentaerythritol poly(meth)acrylate, alkyl-modified dipentaerythritol tri(meth)acrylate, ditrimethylolpropane tetra(meth)acrylate, pentaerythritol ethoxy-tetra(meth)acrylate, pentaerythritol tetra(meth)acrylate, etc.

Of those, especially preferred for use in the invention are EO-modified glycerol tri(meth)acrylate, PO-modified glycerol tri(meth)acrylate, trimethylolpropane tri(meth)acrylate, EO-modified trimethylolpropane tri(meth)acrylate, PO-modified trimethylolpropane tri(meth)acrylate, dipentaerythritol hexa(meth)acrylate, pentaerythritol ethoxy-tetra (meth)acrylate, pentaerythritol tetra(meth)acrylate, etc.

The oxirane ring-having compound (epoxy compound) includes, for example, polyglycidyl esters of polybasic acids, polyglycidyl ethers of polyalcohols, polyglycidyl ethers of polyoxyalkylene glycols, polyglycidyl ethers of aromatic polyols, hydrogenated polyglycidyl ethers of aromatic polyols, urethane-polyepoxy compounds, epoxidated polybutadienes, etc. One or more of these compounds may be used either singly or as combined.

Examples of the oxirane ring-having compound (epoxy compound) preferred for use in the invention include bisphenol A diglycidyl ether, bisphenol F diglycidyl ether, bisphenol S diglycidyl ether, brominated bisphenol A diglycidyl ether, brominated bisphenol F diglycidyl ether, brominated bisphenol S diglycidyl ether, hydrogenated bisphenol A diglycidyl ether, hydrogenated bisphenol F diglycidyl ether, hydrogenated bisphenol S diglycidyl ether, 1,4-butanediol diglycidyl ether, 1,6-hexanediol diglycidyl ether, glycerin triglycidyl ether, trimethylolpropane triglycidyl ether, polyethylene glycol diglycidyl ether, polypropylene glycol diglycidyl ether; polyglycidyl ethers of polyether polyols produced by adding one or more alkylene oxides to aliphatic polyalcohol such as ethylene glycol, propylene glycol, glycerin or the like; diglycidyl esters of aliphatic long-chain dibasic acids; monoglycidyl ethers of aliphatic higher alcohols; monoglycidyl ethers of polyether alcohols produced by adding alkyleneoxide to phenol, cresol, butylphenol or the like; glycidyl esters of higher fatty acids, etc.

Of those, especially preferred are bisphenol A diglycidyl ether, bisphenol F diglycidyl ether, hydrogenated bisphenol A diglycidyl ether, hydrogenated bisphenol F diglycidyl ether, 1,4-butanediol diglycidyl ether, 1,6-hexanediol diglycidyl ether, glycerin triglycidyl ether, trimethylolpropane triglycidyl ether, neopentyl glycol diglycidyl ether, polyethylene glycol diglycidyl ether, polypropylene glycol diglycidyl ether.

Commercial products favorable for use herein as the glycidyl group-having compound are UVR-6216 (by Union Carbide), Glycidol, AOEX24, Cyclomer A200 (all by Daicel Chemical Industry), Epikote 828, Epikote 812, Epikote 1031, Epikote 872, Epikote CT508 (all by Yuka Shell), KRM-2400, KRM-2410, KRM-2408, KRM-2490, KRM-2720, KRM-2750 (all by Asahi Denka Kogyo), etc. One or more of these may be used either singly or as combined.

The production method for the oxirane ring-having compounds is not specifically defined. For example, the compounds may be produced with reference to publications of Lecture of Experimental Chemistry 20, 4th Ed., Organic Synthesis II, p. 213, ff. (Maruzen, 1992); The chemistry of heterocyclic compounds—Small Ring Heterocycles, Part 3, Oxiranes (edited by Alfred Hasfner, John & Wiley and Sons, An Interscience Publication, New York, 1985); Yoshimura, Adhesive, Vol. 29, No. 12, 32, 1985; Yoshimura, Adhesive, Vol. 30, No. 5, 42, 1986; Yoshimura, Adhesive, Vol. 30, No. 7, 42, 1986; JP-A-11-100378, Japanese Patents 2906245 and 2926262.

As the other polymerizable monomer for use in the invention, vinyl ether compounds may be in the composition.

Any known vinyl ether compounds are usable, including, for example, 2-ethylhexyl vinyl ether, butanediol 1,4-divinyl ether, diethylene glycol monovinyl ether, ethylene glycol divinyl ether, triethylene glycol divinyl ether, 1,2-propanediol divinyl ether, 1,3-propanediol divinyl ether, 1,3-butanediol divinyl ether, 1,4-butanediol divinyl ether, tetramethylene glycol divinyl ether, neopentyl glycol divinyl ether, trimethylolpropane trivinyl ether, trimethylolethane trivinyl ether, hexanediol divinyl ether, tetraethylene glycol divinyl ether, pentaerythritol divinyl ether, pentaerythritol trivinyl ether, pentaerythritol tetravinyl ether, sorbitol tetravinyl ether, sorbitol pentavinyl ether, ethylene glycol diethylene vinyl ether, triethylene glycol diethylene vinyl ether, ethylene glycol dipropylene vinyl ether, triethylene glycol diethylene vinyl ether, trimethylolpropane triethylene vinyl ether, trimethylolpropane diethylene vinyl ether, pentaerythritol diethylene vinyl ether, pentaerythritol triethylene vinyl ether, pentaerythritol tetraethylene vinyl ether, 1,1,1-tris[4-(2-vinyloxyethoxy)phenyl]ethane, bisphenol A divinyloxyethyl ether, etc.

These vinyl ether compounds can be produced, for example, according to the method described in Stephen. C. Lapin, Polymers Paint Colour Journal, 179 (4237), 321 (1988), concretely through reaction of a polyalcohol or a polyphenol with acetylene, or through reaction of a polyalcohol or a polyphenol with a halogenalkyl vinyl ether. One or more of these compounds may be used either singly or as combined.

As the other polymerizable monomer for use in the invention, styrene derivatives may also be employed. The styrene derivatives include, for example, styrene, p-methylstyrene, p-methoxystyrene, β-methylstyrene, p-methyl-β-methylstyrene, α-methylstyrene, p-methoxy-β-methylstyrene, p-hydroxystyrene, etc.

For the purpose of enhancing the releasability from mold and the coatability of the composition, a fluorine atom-having compound may be incorporated into the composition. The compound includes, for example, trifluoromethyl(meth)acrylate, pentafluoroethyl (meth)acrylate, (perfluorobutyl)ethyl(meth)acrylate, perfluorobutyl-hydroxypropyl(meth)acrylate, (perfluorohexyl)ethyl(meth)acrylate, octafluoropentyl (meth)acrylate, perfluorooctylethyl(meth)acrylate, tetrafluoropropyl(meth)acrylate, etc.

As the other polymerizable monomer for use in the invention, propenyl ethers and butenyl ethers may also be employed. Preferred examples of the propenyl ethers and butenyl ethers include, for example, 1-dodecyl-1-propenyl ether, 1-dodecyl-1-butenyl ether, 1-butenoxymethyl-2-norbornene, 1,4-di(1-butenoxy)butane, 1,10-di(1-butenoxy)decane, 1,4-di(1-butenoxymethyl)cyclohexane, diethylene glycol di(1-butenyl)ether, 1,2,3-tri(1-butenoxy)propane, propenyl ether propylene carbonate, etc.

The preferred content of the other polymerizable monomer mentioned in the above varies depending on the content of the specific polymerizable monomer for use in the invention. For example, the content of the other polymerizable monomer in the composition of the invention is preferably from 0 to 90% by mass of all the polymerizable monomers constituting the composition, more preferably from 5 to 80% by mass, even more preferably from 10 to 50% by mass.

Preferred blend embodiments of the polymerizable monomer (Ax) and the other polymerizable monomer (hereinafter these are, as combined, referred to as "polymerizable unsaturated monomers") in the invention are described below.

A monofunctional polymerizable unsaturated monomer is generally used as a reactive diluent, and this has an effect of lowering the viscosity of the curable composition for nanoimprints of the invention; and preferably, its amount in the composition is at least 15% by mass of the total amount of the polymerizable monomers, more preferably from 20 to 80% by mass, even more preferably from 25 to 70% by mass, still more preferably from 30 to 60% by mass.

A monomer having two unsaturated bond-having groups (difunctional polymerizable unsaturated monomer) is added to the composition preferably in an amount of at most 90% by mass of all the polymerizable unsaturated monomers, more preferably at most 80% by mass, even more preferably at most 70% by mass. The proportion of the monofunctional and difunctional polymerizable unsaturated monomers is preferably from 10 to 100% by mass of all the polymerizable unsaturated monomers, more preferably from 30 to 95% by mass, even more preferably from 50 to 90% by mass. The proportion of the polyfunctional polymerizable unsaturated monomer having 3 or more unsaturated bond-having groups in the composition is preferably at most 80% by mass of all the polymerizable unsaturated monomers, more preferably at most 70% by mass, even more preferably at most 60% by mass. When the proportion of the polyfunctional polymerizable unsaturated monomer having 3 or more unsaturated bond-having groups is at most 80% by mass, it is favorable since the viscosity of the composition may be lowered.

A more preferred blend embodiment of the polymerizable monomer (Ax) and the other polymerizable monomer in the invention comprises from 20 to 90% by mass, relative to all the polymerizable monomers constituting the composition, of a monofunctional polymerizable monomer (Ax), from 0 to 50% by mass of a monofunctional polymerizable monomer except the polymerizable monomer (Ax), from 10 to 50% by mass of a 2- and/or 3-functional polymerizable monomer except the polymerizable monomer (Ax), and from 0 to 30% by mass of a 4-functional or more polyfunctional polymerizable monomer except the polymerizable monomer (Ax). A most preferred blend embodiment comprises from 40 to 80% by mass of a monofunctional polymerizable monomer (Ax), from 0 to 40% by mass of a monofunctional polymerizable monomer except the polymerizable monomer (Ax), from 20 to 50% by mass of a 2- and/or 3-functional polymerizable monomer except the polymerizable monomer (Ax), and from 0 to 10% by mass of a 4-functional or more polyfunctional polymerizable monomer except the polymerizable monomer (Ax). In addition to the above-mentioned blend embodiments, also preferred is an embodiment where the proportion of a polymerizable monomer having an acrylate group as the polymerizable functional group is from 90 to 100% by mass of all the polymerizable monomers constituting the composition. The composition of those embodiments may satisfy all the photocurability, the mold chargeability, the dry etching resistance and the mold releasability on a high level.

(Photopolymerization Initiator (B))

The curable composition for nanoimprints of the invention contains a photopolymerization initiator. As the photopolymerization initiator in the invention, usable is any compound capable of generating an active radical for polymerization of the above-mentioned polymerizable monomer through photoirradiation. As the photopolymerization initiator, preferred are a radical polymerization initiator of generating a radical through photoirradiation, and a cationic polymerization initiator of generating an acid through photoirradiation; and more preferred is a radical polymerization initiator. Depending on the type of the polymerizable group of the polymerizable monomer, the initiator may be suitably selected. Specifically, as the photopolymerization initiator in the invention, one active to the wavelength of the light source used is incorporated in the composition, and one capable of generating a suitable active radical in accordance with the difference in the reaction mode (e.g., radical polymerization or cationic polymerization) must be used. In the invention, two or more different types of photopolymerization initiators may be used, as combined.

The content of the photopolymerization initiator to be in the composition of the invention may be, for example, from 0.01 to 15% by mass of all the polymerizable monomers constituting the composition, preferably from 0.1 to 12% by mass, more preferably from 0.2 to 7% by mass. In case where two or more different types of photopolymerization initiators are used, the total amount thereof falls within the above range.

When the content of the photopolymerization initiator is at least 0.01% by mass, then it is favorable since the sensitivity (rapid curability), the power of resolution, the line edge accuracy and the coating film strength of the composition tend to be better. On the other hand, when the content of the photopolymerization initiator is at most 15% by mass, it is also favorable since the light transmittance, the discoloration resistance and the handlability of the composition tend to be better. Heretofore, inkjet compositions and compositions for liquid-crystal display color filters containing dye and/or pigments have been variously investigated in point of the preferred amount of the photopolymerization initiator and/or the photoacid generator to be in the compositions; however, there is no report relating to the preferred amount of the photopolymerization initiator and/or the photoacid generator to be added to photocurable compositions for nanoimprints. In this connection, in the systems containing dye and/or pigment, the dye and/or the pigment may act as a radical-trapping agent and may have some influence on the photopolymerization and the sensitivity of the compositions. Taking this into consideration, the amount of the photopolymerization initiator to be added to these applications is optimized. On the other hand, in the curable composition for nanoimprints of the invention, dye and/or pigment are not indispensable ingredients, and the optimum range of the photopolymerization initiator in the composition may differ from that in the field of inkjet compositions and compositions for liquid-crystal display color filters.

As the radical photopolymerization initiator for use in the invention, preferred are acylphosphine oxide compounds and oxime ester compounds from the viewpoint of the curing sensitivity and the absorption characteristics of the composition. As the photopolymerization initiator, for example, commercial products may be used. Their examples are Irgacure® 2959 (1-[4-(2-hydroxyethoxy)phenyl]-2-hydroxy-2-methyl-1-propan-1-one), Irgacure® 184 (1-hydroxycyclohexyl phenyl ketone), Irgacure® 500 (1-hydroxycyclohexyl phenyl ketone, benzophenone), Irgacure® 651 (2,2-dimethoxy-1,2-diphenylethane-1-one), Irgacure® 369 (2-benzyl-2-dimethylamino-1-(4-morpholinophenyl)butanone-1), Irgacure® 907 (2-methyl-1[4-methylthiophenyl]-2-morpholinopropan-1-one), Irgacure® 819 (bis(2,4,6-trimethylbenzoyl)-phenylphosphine oxide), Irgacure® 1800 (bis(2,6-dimethoxybenzoyl)-2,4,4-trimethylpentylphosphine oxide, 1-hydroxycyclohexyl phenyl ketone), Irgacure® 1800 (bis(2,6-dimethoxybenzoyl)-2,4,4-trimethylpentylphosphine oxide, 2-hydroxy-2-methyl-1-phenyl-1-propan-1-one), Irgacure® OXE01 (1,2-octanedione, 1-[4-(phenylthio)phenyl]-2-(O-benzoyloxime)), Darocur® 1173 (2-hydroxy-2-methyl-1-phenyl-1-propan-1-one), Darocur® 1116, 1398, 1174 and 1020, CGI242 (ethanone, 1-[9-ethyl-6-(2-methylbenzoyl)-9H-carbazol-3-yl]-1-(O-acetyloxime)), which are all available from Ciba; Lucirin TPO (2,4,6-trimethylbenzoyl-diphenylphosphine oxide), Lucirin TPO-L (2,4,6-trimethylbenzoylphenylethoxyphosphine oxide) which are both available from BASF; Esacure 1001M (1-[4-benzoylphenylsulfanyl]phenyl)-2-methyl-2-(4-methylphenylsulfonyl)propan-1-one available from Nihon SiberHegner; Adeka Optomer® N-1414 (carbazole/phenone compound), Adeka Optomer® N-1717 (acridine compound), Adeka Optomer® N-1606 (triazine compound), all available from Asahi Denka; Sanwa Chemical's TFE-triazine (2-[2-(furan-2-yl)vinyl]-4,6-bis(trichloromethyl)-1,3,5-triazine), Sanwa Chemical's TME-triazine (2-[2-(5-methylfuran-2-yl)vinyl]-4,6-bis(trichloromethyl)-1,3,5-triazine), Sanwa Chemical's MP-triazine (2-(4-methoxyphenyl)-4,6-bis(trichloromethyl)-1,3,5-triazine); Midori Chemical's TAZ-113 (2-[2-(3,4-dimethoxyphenyl)ethenyl]-4,6-bis(trichloromethyl)-1,3,5-triazine), Midori Chemical's TAZ-108 (2-(3,4-dimethoxyphenyl)-4,6-bis(trichloromethyl)-1,3,5-triazine; as well as benzophenone, 4,4'-bisdiethylaminobenzophenone, methyl-2-benzophenone, 4-benzoyl-4'-methyldiphenyl sulfide, 4-phenylbenzophenone, ethyl Michler's ketone, 2-chlorothioxanthone, 2-methylthioxanthone, 2-isopropylthioxanthone, 4-isopropylthioxanthone, 2,4-diethylthioxanthone, 1-chloro-4-propoxythioxanthone, 2-methylthioxanthone, thioxanthone ammonium salt, benzoin, 4,4'-dimethoxybenzoin, benzoin methyl ether, benzoin ethyl ether, benzoin isopropyl ether, benzoin isobutyl ether, benzyl dimethyl ketal, 1,1,1-trichloroacetophenone, diethoxyacetophenone, dibenzosuberone, methyl o-benzylbenzoate, 2-benzoylnaphthalene, 4-benzylbiphenyl, 4-benzoyldiphenyl ether, 1,4-benzoylbenzene, benzil, 10-butyl-2- chloroacridone, [4-(methylphenylthio)phenyl] phenylmethane), 2-ethylanthraquinone, 2,2-bis(2-chlorophenyl)-4,5,4',5'-tetrakis(3,4,5-trimethoxyphenyl)-1,2'-biimidazole, 2,2-bis(o-chlorophenyl)-4,5,4',5'-tetraphenyl-1,2'-biimidazole, tris(4-dimethylaminophenyl) methane, ethyl 4-(dimethylamino)benzoate, 2-(dimethylamino)ethyl benzoate, butoxyethyl 4-(dimethylamino)benzoate, etc.

In the invention, "light" includes not only those having with a wavelength falling within a range of ultraviolet, near-ultraviolet, far-ultraviolet, visible, infrared, and electromagnetic waves but also radiations. The radiations include, for example, microwaves, electron beams, EUV, X-rays. In addition, laser rays such as 248 nm excimer laser, 193 nm excimer laser, 172 nm excimer laser are also usable herein. These lights may be monochromatic lights (single wavelength lights) having passed through optical filters, or may be lights of different wavelengths (composite lights). For photoexposure, multiple photoexposure may be employable, and for the purpose of enhancing the film strength and the etching resistance of the composition, entire surface photoexposure may be effected after pattern formation.

The photopolymerization initiator in the invention must be suitably selected depending on the wavelength of the light source used; and preferred are those not generating gas during mold compression and photoexposure. Gas generation, if any, may cause mold contamination, therefore giving problems in that the mold must be washed frequently and the photocurable composition may be deformed in the mold and the transferred pattern accuracy may be thereby worsened.

The curable composition for nanoimprints of the invention is preferably a radical-polymerizable composition, in which the polymerizable monomer (A) is a radical-polymerizable monomer and the photopolymerization initiator (B) is a radical polymerization initiator that generates a radical through photoirradiation.

(Other Ingredients)

In addition to the above-mentioned polymerizable monomer (A) and the photopolymerization initiator (B), the curable composition for nanoimprints of the invention may contain any other ingredients such as surfactant, antioxidant, solvent, polymer and others for various purposes not detracting from the effect of the invention. Preferably, the curable composition for nanoimprints of the invention contain at least one selected from fluorine-containing surfactant, silicone-type surfactant, fluorine-containing silicone-type surfactant, and antioxidant.

Surfactant

Preferably, the curable composition for nanoimprints of the invention contains a surfactant. The content of the surfactant that may be in the composition may be, for example, from 0.001 to 5% by mass of the composition, preferably from 0.002 to 4% by mass, more preferably from 0.005 to 3% by mass. In case where two or more different types of surfactants are in the composition, the total amount thereof falls within the above range. When the surfactant content in the composition falls from 0.001 to 5% by mass, it is favorable from the viewpoint of the coating uniformity, therefore hardly worsening the mold transferability owing to excessive surfactant.

As the surfactant, preferably, the composition contains at least one of a fluorine-containing surfactant, a silicone-type surfactant, a fluorine-containing silicone-type surfactant, more preferably contains both of a fluorine-containing surfactant and a silicone-type surfactant, or contains a fluorine-containing silicone-type surfactant, most preferably contains a fluorine-containing silicone-type surfactant. The fluorine-containing surfactant and the silicone-type surfactant are preferably nonionic surfactants.

"Fluorine-containing silicone-type surfactant" as referred to herein means a surfactant satisfying both the requirement of a fluorine-containing surfactant and that of a silicone-type surfactant.

Using the surfactant of the type may solve the problem of coating failures such as striation and flaky pattern formation (drying unevenness of resist film) that may occur when the curable composition for nanoimprints of the invention is applied onto substrates on which various films are formed, for example, onto silicon wafers in semiconductor production, or onto glass square substrates, chromium films, molybdenum films, molybdenum alloy films, tantalum films, tantalum alloy films, silicon nitride films, amorphous silicon films, tin oxide-doped indium oxide (ITO) films or tin oxide films in production of liquid-crystal devices. In addition, the surfactant is effective for enhancing the flowability of the composition of the invention in the cavity of a female mold, for enhancing the mold-resist releasability, for enhancing the resist adhesiveness to substrates, and for lowering the viscosity of the composition. In particular, when the above-mentioned surfactant is added to the composition for nanoimprints of the invention, the coating uniformity of the composition can be greatly improved; and in coating with it using a spin coater or a slit scan coater, the composition ensures good coating aptitude irrespective of the size of the substrate to which it is applied.

Examples of the nonionic fluorine-containing surfactant usable in the invention include Fluorad FC-430, FC-431 (Sumitomo 3M's trade names); Surflon S-382 (Asahi Glass's trade name); Eftop EF-122A, 122B, 122C EF-121, EF-126, EF-127, MF-100 (Tochem Products' trade names); PF-636, PF-6320, PF-656, PF-6520 (Omnova Solution's trade names); Futagent FT250, FT251, DFX18 (Neos' trade names); Unidyne DS-401, DS-403, DS-451 (Daikin's trade names); Megafac 171, 172, 173, 178K, 178A (Dai-Nippon Ink's trade names).

Examples of the nonionic silicone-type surfactant include SI-10 series (Takemoto Yushi's trade name), Megafac Paintad 31 (Dai-Nippon Ink's trade name), KP-341 (Shin-Etsu Chemical's trade name).

Examples of the fluorine-containing silicone-type surfactant include X-70-090, X-70-091, X-70-092, X-70-093 (Shin-Etsu Chemical's trade names); Megafac R-08, XRB-4 (Dai-Nippon Ink's trade names).

Antioxidant

Preferably, the curable composition for nanoimprints of the invention contains a known antioxidant. The content of the antioxidant to be in the composition is, for example, from 0.01 to 10% by mass of the total amount of the polymerizable monomers constituting the composition, preferably from 0.2 to 5% by mass. When two or more different types of antioxidants are in the composition, the total amount thereof falls within the above range.

The antioxidant is for preventing fading by heat or photoirradiation, and for preventing fading by various gases such as ozone, active hydrogen NOx, SOx (x is an integer), etc. Especially in the invention, the antioxidant added to the composition brings about the advantage that the cured film is prevented from being discolored and the film thickness is prevented from being reduced through decomposition. The antioxidant includes hydrazides, hindered amine-type antioxidants, nitrogen-containing heterocyclic mercapto compounds, thioether-type antioxidants, hindered phenol-type antioxidants, ascorbic acids, zinc sulfate, thiocyanates, thiourea derivatives, saccharides, nitrites, sulfites, thiosulfates, hydroxylamine derivatives, etc. Of those, preferred are hindered phenol-type antioxidants and thioether-type antioxidants from the viewpoint of their effect of preventing cured film discoloration and preventing film thickness reduction.

Commercial products of the antioxidant usable herein include Irganox 1010, 1035, 1076, 1222 (all by Ciba-Geigy); Antigene P, 3C, FR, Sumilizer S, Sumilizer GA80 (by Sumitomo Chemical); Adekastab AO70, AO80, AO503 (by Adeka), etc. These may be used either singly or as combined.
Solvent A solvent may be used for the curable composition for nanoimprints of the invention, in accordance with various needs. In particular, when a pattern having a thickness of at most 500 nm is formed, the composition preferably contains a solvent. Preferably, the solvent has a boiling point at normal pressure of from 80 to 200° C. Regarding the type of the solvent, any solvent capable of dissolving the composition may be used. Preferred are solvents having at least any one of an ester structure, a ketone structure, a hydroxyl group and an ether structure. Concretely, the solvent is preferably one or more selected from propylene glycol monomethyl ether acetate, cyclohexanone, 2-heptanone, gamma-butyrolactone, propylene glycol monomethyl ether, ethyl lactate. Most preferred is a solvent containing propylene glycol monomethyl ether acetate as securing coating uniformity.

The content of the solvent in the composition of the invention may be suitably optimized depending on the viscosity of the constitutive ingredients except the solvent, the coatability of the composition and the intended thickness of the film to be formed. From the viewpoint of the coatability, the solvent content is preferably from 0 to 95% by mass of the composition, more preferably from 0 to 90% by mass. In forming a patter having a thickness of at most 500 nm, the solvent content is preferably from 10 to 95% by mass, more preferably from 30 to 90% by mass, even more preferably from 40 to 90% by mass.
Polymer Ingredient The composition of the invention may contain a polyfunctional oligomer having a larger molecular weight than that of the above-mentioned, other polyfunctional monomer within a range capable of attaining the object of the invention, for the purpose of further increasing the crosslinking density of the composition. Examples of the photoradical-polymerizable polyfunctional oligomer include various acrylate oligomers such as polyester acrylates, urethane acrylates, polyether acrylates, epoxy acrylates. The amount of the oligomer ingredient to be added to the composition may be preferably from 0 to 30% by mass of the composition except the solvent therein, more preferably from 0 to 20% by mass, even more preferably from 0 to 10% by mass, most preferably from 0 to 5% by mass.

The curable composition for nanoimprints of the invention may contain any other polymer ingredient for the purpose of enhancing the dry etching resistance, the imprint aptitude and the curability of the composition. The polymer ingredient is preferably a polymer having a polymerizable functional group in the side chain thereof. The weight-average molecular weight of the polymer ingredient is preferably from 2000 to 100000, more preferably from 5000 to 50000, from the viewpoint of the miscibility of the polymer with the polymerizable monomers constituting the composition. The amount of the polymer ingredient to be added may be preferably from 0 to 30% by mass of the composition except the solvent therein, more preferably from 0 to 20% by mass, even more preferably from 0 to 10% by mass, most preferably at most 2% by mass. When the content of the polymer ingredient having a molecular weight of at least 2000 in the composition of the invention is at most 30% by mass of the composition except the solvent therein, then the patternability of the composition is bettered. From the viewpoint of the patternability of the composition, the resin content therein is preferably as small as possible, and except for the surfactant and other minor additives, preferably, the composition does not contain any additional resin ingredient.

In addition to the above-mentioned ingredients, the curable composition for nanoimprints of the invention may contain, if desired, release agent, silane coupling agent, polymerization inhibitor, UV absorbent, light stabilizer, antiaging agent, plasticizer, adhesion promoter, thermal polymerization initiator, colorant, elastomer particles, photoacid enhancer, photobase generator, basic compound, flowability promoter, defoaming agent, dispersant, etc.

The curable composition for nanoimprints of the invention can be produced by mixing the above-mentioned ingredients. After the ingredients are mixed, the resulting mixture may be filtered through a filter having a pore size of from 0.05 μm to 5.0 μm to give a solution. The ingredients may be mixed and dissolved to prepare the curable composition, generally at a temperature falling within a range of from 0° C. to 100° C. The filtration may be effected in plural stages, or may be repeated plural times. The solution once filtered may be again filtered. Not specifically defined, the material of the filter may be any one, for example, polyethylene resin, polypropylene resin, fluororesin, nylon resin, etc.

Preferably, the viscosity of the curable composition for nanoimprints of the invention, except the solvent therein, at 25° C. is from 1 to 100 mPa·s, more preferably from 2 to 50 mPa·s, even more preferably from 5 to 30 mPa·s. Having a viscosity as controlled within a suitable range, the composition may be improved in that the rectangular profile of the pattern to be formed may be bettered and the residual film after patterning may be reduced.
[Patterning Method]

The patterning method (especially micropatterning method) of using the curable composition for nanoimprints of the invention is described below. The patterning method of the invention comprises applying the curable composition for nanoimprints of the invention onto a substrate or a support (base) to form a patterning layer thereon; pressing a mold against the surface of the patterning layer; and irradiating the patterning layer with light, thereby curing the composition of the invention to form a micropattern.

Preferably, the curable composition for nanoimprints of the invention is, after irradiated with light, further heated and cured. Concretely, at least the composition of the invention is applied onto a substrate (base or support) and optionally dried to form a layer comprising the composition of the invention (patterning layer), thereby preparing a pattern acceptor (having the patterning layer formed on the substrate), then a mold is pressed against the surface of the patterning layer of the pattern acceptor to thereby transfer the mold pattern onto the pattern acceptor, and the resulting micropatterned layer is cured through photoirradiation. The photonanoimprint lithography of the patterning method of the invention may enable lamination and multi-layer patterning, and therefore may be combined with ordinary imprint technology.

The curable composition for nanoimprints of the invention may form a finer micropattern through photonanoimprint lithography, at low cost and with high accuracy. Accordingly, the composition of the invention can form micropatterns heretofore formed according to conventional lithography at low cost and with high accuracy. For example, when the composition of the invention is applied onto a substrate and the composition layer is exposed to light, cured and optionally dried (baked), then permanent films of overcoat layers or insulating films for use in liquid-crystal displays (LCD) may be formed and the formed films may be used as an etching resist in producing semiconductor integrated circuits, recording materials or flat panel displays. In particular, the patterns formed of the curable composition for nanoimprints of the invention are excellent in etching aptitude, and can therefore be used as etching resists in dry etching with fluorocarbon, etc.

In permanent films (resists for structural members) for use in liquid-crystal displays (LCD) and in resists for use for substrate processing for electronic materials, the resist is preferably prevented from being contaminated as much as possible with metallic or organic ionic impurities in order that the resist does not interfere with the performance of the products. Accordingly, the concentration of the metallic or organic ionic impurities in the curable composition for nanoimprints of the invention is preferably at most 1000 ppm, more preferably at most 10 ppm, even more preferably at most 100 ppb.

The patterning method (pattern transferring method) with the curable composition for nanoimprints of the invention is described concretely hereinunder.

In the patterning method of the invention, the composition of the invention is first applied onto a support to form a patterning layer thereon.

The coating method for applying the curable composition for nanoimprints of the invention onto a substrate may be a well known coating method of, for example, a dip coating method, an air knife coating method, a curtain coating method, a wire bar coating method, a gravure coating method, an extrusion coating method, a spin coating method, a slit scanning method, an inkjet method, etc. Particularly preferred are an inkjet method and a spin coating method from the viewpoint of the mold chargeability and reduction of the residual film thickness. The thickness of the patterning method of the composition of the invention may vary depending on the use thereof, and may be from 0.05 μm to 30 μm or so. The composition of the invention may be applied in a mode of multilayer coating. Between the substrate and the patterning method of the composition of the invention, any other organic layer may be formed, such as a planarizing layer, etc. With that, the patterning layer is not kept in direct contact with the substrate, and therefore, the substrate may be prevented from being contaminated with dust or from being scratched, and the adhesiveness of the patterning layer to the substrate may be enhanced. The pattern to be formed of the composition of the invention may have good adhesiveness to the organic layer, if any, formed on the substrate.

The substrate (base or support) to which the curable composition for nanoimprints of the invention is applied may be selected from various materials depending on its use, including, for example, quartz, glass, optical film, ceramic material, vapor deposition film, magnetic film, reflective film, metal substrate of Ni, Cu, Cr, Fe or the like, paper, SOG (spin on glass), polymer substrate such as polyester film, polycarbonate film or polyimide film, TFT array substrate, PDP electrode plate, glass or transparent plastic substrate, electroconductive substrate of ITO, metal or the like, insulating substrate, semiconductor substrate such as silicon, silicon nitride, polysilicon, silicon oxide or amorphous silicon, which, however, are not limitative. The shape of the substrate is not also specifically defined. It may be tabular or roll. As described below, the substrate may be light-transmissive or non-light-transmissive, depending on the combination thereof with a mold.

Next, in the patterning method of the invention, a mold is pressed against the surface of the patterning layer for transferring the pattern from the mold onto the patterning layer. Accordingly, the micropattern previously formed on the pressing surface of the mold is transferred onto the patterning layer.

The mold material usable in the invention is described. IN the photonanoimprint lithography with the composition of the invention, a light-transmissive material is selected for at least one of the mold material and/or the substrate. In the photonanoimprint lithography applied to the invention, the curable composition for nanoimprints of the invention is applied onto a substrate to form a patterning layer thereon, and a light-transmissive mold is pressed against the surface of the layer, then this is irradiated with light from the back of the mold and the patterning layer is thereby cured. Alternatively, the curable composition for photonanoimprints is applied onto a light-transmissive substrate, then a mold is pressed against it, and this is irradiated with light from the back of the substrate whereby the curable composition for photonanoimprints can be cured.

The photoirradiation may be attained while the mold is kept in contact with the layer or after the mold is released. In the invention, preferably, the photoirradiation is attained while the mold is kept in contact with the patterning layer.

The mold usable in the invention has a transferable pattern formed thereon. The pattern of the mold may be formed, for example, through photolithography, electronic beam lithography or the like by which a pattern may be formed to a desired processing accuracy. In the invention, however, the mold patterning method is not specifically defined.

Not specifically defined, the light-transmissive mold material for use in the invention may be any one having a desired strength and durability. Concretely, its examples include glass, quartz, light-transparent resin such as PMMA or polycarbonate resin, transparent metal deposition film, flexible film of polydimethylsiloxane or the like, photocured film, metal film, etc.

The non-light-transmissive mold to be used in the invention where a light-transmissive substrate is used is not also specifically defined and may be any one having a predetermined strength. Concretely, examples of the mold material include ceramic material, deposition film, magnetic film, reflective film, metal material of Ni, Cu, Cr, Fe or the like, as well as SiC, silicon, silicon nitride, polysilicon, silicon oxide, amorphous silicon, etc. However, these are not limitative. The shape of the mold is not also specifically defined, and may be any of a tabular mold or a roll mold. The roll mold is used especially when continuous transfer in patterning is desired.

The mold for use in the patterning method of the invention may be processed for surface release treatment for the purpose of enhancing the releasability of the curable composition for nanoimprint of the invention from the mold. The mold of the type includes those surface-treated with a silicone-type or fluorine-containing silane coupling agent, for which, for example, commercial release agents such as Daikin's Optool DSX, Sumitomo 3M's Novec EGC-1720 and others are preferred.

In photoimprint lithography with the composition of the invention, in general, the mold pressure in the patterning method of the invention is preferably at most 10 atmospheres. When the mold pressure is at most 10 atmospheres, then the mold and the substrate are hardly deformed and the patterning accuracy tends to increase. It is also favorable since the pressure unit may be small-sized since the pressure to be given to the mold may be low. The mold pressure is preferably selected from the region capable of securing the mold transfer uniformity, within a range within which the residual film of the curable composition for nanoimprints in the area of mold pattern projections may be reduced.

In the patterning method of the invention, the dose of photoirradiation in the step of irradiating the patterning layer with light may be sufficiently larger than the dose necessary for curing. The dose necessary for curing may be suitably determined depending on the degree of consumption of the unsaturated bonds in the curable composition for nanoimprints and on the tackiness of the cured film as previously determined.

In the photonanoimprint lithography applied to the invention, the substrate temperature in photoirradiation may be room temperature; however, the photoirradiation may be attained under heat for enhancing the reactivity. In the previous stage of photoirradiation, preferably, the system is kept in vacuum as effective for preventing contamination with bubbles or contamination with oxygen or for preventing the reduction in reactivity, and as effective for enhancing the adhesiveness of the curable composition for nanoimprints with mold. The system may be subjected to photoirradiation while still kept in vacuum. In the patterning method of the invention, the vacuum degree in photoirradiation is preferably from $10^{-1}$ Pa to ordinary pressure.

Light to be used for photoirradiation to cure the curable composition for nanoimprints of the invention is not specifically defined. For example, it includes light and irradiations with a wavelength falling within a range of high-energy ionizing radiation, near-ultraviolet, far-ultraviolet, visible, infrared, etc. The high-energy ionizing radiation source includes, for example, accelerators such as Cockcroft accelerator, Handegraf accelerator, linear accelerator, betatoron, cyclotron, etc. The electron beams accelerated by such an accelerator are used most conveniently and most economically; but also are any other radioisotopes and other radiations from nuclear reactors, such as $\gamma$ rays, X rays, $\alpha$ rays, neutron beams, proton beams, etc. The UV sources include, for example, UV fluorescent lamp, low-pressure mercury lamp, high-pressure mercury lamp, ultra-high-pressure mercury lamp, xenon lamp, carbon arc lamp, solar lamp, etc. The radiations include microwaves, EUV, etc. In addition, laser rays for use in microprocessing of semiconductors, such as LED, semiconductor laser ray, 248 nm KrF excimer laser ray, 193 nm ArF excimer laser ray and others, are also favorably used in the invention. These lights may be monochromatic lights, or may also be lights of different wavelengths (mixed lights).

In photoexposure, the light intensity is preferably within a range of from 1 mW/cm$^2$ to 50 mW/cm$^2$. When the light intensity is at least 1 mW/cm$^2$, then the producibility may increase since the photoexposure time may be reduced; and when the light intensity is at most 50 mW/cm$^2$, then it is favorable since the properties of the permanent film formed may be prevented from being degraded owing to side reaction. Also preferably, the dose in photoexposure is within a range of from 5 mJ/cm$^2$ to 1000 mJ/cm$^2$. When the dose is less than 5 mJ/cm$^2$, then the photoexposure margin may be narrow and there may occur problems in that the photocuring may be insufficient and the unreacted matter may adhere to mold. On the other hand, when the dose is more than 1000 mJ/cm$^2$, then the composition may decompose and the permanent film formed may be degraded.

Further, in photoexposure, the oxygen concentration in the atmosphere may be controlled to be less than 100 mg/L by introducing an inert gas such as nitrogen or argon into the system for preventing the radical polymerization from being retarded by oxygen.

In the patterning method of the invention, after the pattern layer is cured through photoirradiation, if desired, the cured pattern may be further cured under heat given thereto. The method may additionally includes the post-curing step. Thermal curing of the composition of the invention after photoirradiation is preferably attained at 150 to 280° C., more preferably at 200 to 250° C. The heating time is preferably from 5 to 60 minutes, more preferably from 15 to 45 minutes.

The pattern formed according to the patterning method of the invention is useful as an etching resist. In case where the composition for nanoimprints of the invention is used as an etching resist, a nano-order micropattern is first formed on a substrate such as a silicon wafer with a thin film of SiO$_2$ or the like formed thereon, according to the patterning method of the invention. Next, this is etched with hydrogen fluoride in wet etching, or with CF$_4$ in dry etching, thereby forming a desired pattern on the substrate. The curable composition for nanoimprints of the invention exhibits especially good etching resistance in dry etching.

The pattern thus formed according to the patterning method of the invention as described in the above can be used as a permanent film (resist for structural members) for use in liquid-crystal displays (LCD) and others, or as an etching resist. After its production, the composition of the invention may be bottled in a container such as a gallon bottle or a coated bottle, and may be transported or stored. In this case, the container may be purged with an inert gas such as nitrogen, argon or the like for preventing the composition therein from being degraded. The composition may be transported or stored at ordinary temperature, but for preventing the permanent film from being degraded, it is preferably transported or stored at a controlled temperature of from −20° C. to 0° C. Needless-to-say, the composition is shielded from light to such a level on which its reaction does not go on.

EXAMPLES

The characteristics of the invention are described more concretely with reference to Production Examples and Examples given below. In the following Examples, the material used, its amount and the ratio, the details of the treatment and the treatment process may be suitably modified or changed not overstepping the scope of the invention. Accordingly, the invention should not be limitatively interpreted by the Examples mentioned below.

Production Example 1

Production of Compound (I-1A)

α-naphthol (150 g) was dissolved in ethyl acetate (600 ml), and triethylamine (158 g) was added thereto. With cooling with ice, acrylic acid chloride (113 g) was added to the solution, taking 1 hour. This was reacted at room temperature for 5 hours, and then water (100 ml) was added thereto and stirred for 1 hour. After stirred, the organic phase was washed with aqueous 1 N hydrochloric acid solution, and then washed with aqueous saturated sodium hydrogencarbonate solution and saturated saline water. The organic phase was dried with sodium sulfate, and then concentrated to give a crude product. This was purified through column chromatography to give the following compound (I-1A) (100 g). The compound (I-1A) was liquid at room temperature, and its viscosity at 25° C. was 27.8 mPa·s.

$^1$H-NMR (CDCl$_3$): δ6.1 (d, 1H), δ6.5 (dd, 1H), δ6.75 (d, 1H), δ7.3 (d, 1H), δ7.5 (m, 3H), δ7.8 (d, 1H), δ7.8-7.9 (m, 2H)

In the above-mentioned Production Example, acrylic acid chloride was changed to methacrylic acid chloride to give a compound (I-1M).

Production Example 2

Production of Compound (I-2A)

β-naphthol (70 g) was dissolved in acetone (400 ml), and triethylamine (69 g) was added thereto. With cooling with ice, acrylic acid chloride (53 g) was added to the solution, taking 1 hour. This was reacted at room temperature for 5 hours, and then water (300 ml) was added thereto and stirred for 1 hour. This was extracted twice with ethyl acetate, the organic phase was washed with aqueous 1 N hydrochloric acid solution, and then washed with aqueous saturated sodium hydrogencarbonate solution and saturated saline water. The organic phase was dried with sodium sulfate, and then concentrated to give a crude product. This was purified through column chromatography to give a compound (I-2A) (51 g).

$^1$H-NMR (CDCl$_3$): δ6.05 (d, 1H), δ6.4 (dd, 1H), δ6.65 (d, 1H), δ7.3 (d, 1H) δ7.5 (m, 2H), δ7.6 (s, 1H), δ7.8-7.9 (m, 3H)

Production Example 3

Production of Compound (I-3A)

1-Hydroxymethylnaphthalene (30 g) was dissolved in acetone (200 ml), and triethylamine (31 g) was added thereto. With cooling with ice, acrylic acid chloride (22 g) was added to the solution, taking 30 minutes. This was reacted at room temperature for 5 hours, and then water (100 ml) was added thereto and stirred for 1 hour. This was extracted twice with ethyl acetate, the organic phase was washed with aqueous 1 N hydrochloric acid solution, and then washed with aqueous saturated sodium hydrogencarbonate solution and saturated saline water. The organic phase was dried with sodium sulfate, and then concentrated to give a crude product. This was purified through column chromatography to give a compound (I-3) (32 g). The compound (I-3A) was liquid at room temperature, and its viscosity at 25° C. was 26.3 mPa·s.

$^1$H-NMR (CDCl$_3$): δ6.05 (d, 1H), δ6.4 (dd, 1H), δ6.65 (d, 1H), δ7.3 (d, 1H), δ7.5 (m, 2H), δ7.6 (s, 1H), δ7.8-7.9 (m, 3H)

Production Example 4

Production of Compound (I-4A)

A compound (I-4A) was produced in the same manner as in Production Example 3 that for the above-mentioned compound (I-3A), for which, however, 2-hydroxymethylnaphthalane was sued in place of 1-hydroxymethylnaphthalane. When stored at 0° C., the compound (1-4A) became solid, and its melting point was 23 to 25° C. So far as stored at 25° C., it was liquid, and its viscosity at 25° C. was 11.0 mPa·s.

Production Example 5

Production of Compound (I-8A)

A compound (I-8A) was produced in the same manner as in Production Example 2, for which, however, 1,5-dihydroxynaphthalene was used in place of β-naphthol.

$^1$H-NMR (CDCl$_3$): δ6.1 (d, 2H), δ6.5 (dd, 2H), δ6.75 (d, 2H), δ7.35 (d, 2H), δ7.5 (t, 2H), δ7.8 (d, 2H)

Production Example 6

Production of Compound (I-9A)

A compound (I-9A) was produced in the same manner as in Production Example 2, for which, however, 2,7-dihydroxynaphthalene was used in place of β-naphthol.

$^1$H-NMR (CDCl$_3$): δ6.05 (d, 2H), δ6.4 (dd, 2H), δ6.65 (d, 2H), δ7.25 (d, 2H), δ7.6 (s, 2H), δ7.85 (d, 2H)

Production Example 7

Production of Compound (I-10A)

A compound (I-10A) was produced in the same manner as in Production Example 2, for which, however, 1,3-dihydroxynaphthalene was used in place of β-naphthol.

$^1$H-NMR (CDCl$_3$): δ6.05 (d, 1H), δ6.1 (d, 1H), δ6.4 (dd, 1H), δ6.45 (dd, 1H), δ6.7 (d, 1H), δ6.75 (d, 1H), δ7.25 (s, 1H), δ7.5-7.6 (m, 3H), δ7.8-7.9 (m, 2H)

Production Example 8

Production of Compound (I-11A)

A compound (I-11A) was produced in the same manner as in Production Example 2, for which, however, 2,3-dihydroxynaphthalene was used in place of β-naphthol.

$^1$H-NMR (CDCl$_3$): δ6.0 (d, 2H), δ6.5 (dd, 2H), δ6.6 (d, 2H), δ7.5 (m, 2H), δ7.75 (s, 2H), δ7.8 (m, 2H)

The compounds (I-1A), (I-3A) and (I-4A) are especially favorable as they are liquid at room temperature and their viscosity is low. The compound (I-2A) is solid at room temperature, but is well miscible with other polymerizable monomers, and is therefore favorably used. Of those, more favorable is the compound (I-4A), as its viscosity is the lowest and its mold chargeability is good.

(Preparation of Curable Composition for Nanoimprints)

To the polymerizable monomers shown in Table 1 below, added were the polymerization initiator P-1 (2% by mass) mentioned below, the surfactant W-1 (0.1% by mass) mentioned below, the surfactant W-2 (0.04% by mass) mentioned below, and antioxidants A-1 and A-2 (1% by mass each) mentioned below, thereby preparing a curable composition for nanoimprints. Poorly soluble ingredients were dissolved after a small amount of acetone or ethyl acetate was added thereto, and the solvent was evaporated away. The compound (I-16A) was from Aldrich.

TABLE 1

| | Monomer (Ax) (g) | Other monomer 1 (g) | Other monomer 2 (g) | Other monomer 3 (g) |
|---|---|---|---|---|
| Example 1 | I-1A (10) | | | |
| Example 2 | I-1A (5) | R-2 (5) | | |
| Example 3 | I-2A (5) | R-2 (5) | | |
| Example 4 | I-3A (5) | R-2 (5) | | |
| Example 5 | I-1M (5) | R-2 (5) | | |
| Example 6 | I-1A (7) | R-2 (2) | R-3 (1) | |
| Example 7 | I-8A (2) | | R-3 (1) | R-1A |
| Example 8 | I-9A (2) | | R-3 (1) | R-1A (7) |
| Example 9 | I-10A (2) | | R-3 (1) | R-1A (7) |
| Example 10 | I-16A (2) | R-1A (4) | R-2 (4) | |
| Example 11 | I-1A (9) | R-4 (1) | | |
| Example 12 | I-1A (8) | R-4 (1) | R-3 (1) | |

TABLE 1-continued

| | Monomer (Ax) (g) | Other monomer 1 (g) | Other monomer 2 (g) | Other monomer 3 (g) |
|---|---|---|---|---|
| Example 13 | I-1A (4) | R-2 (3) | R-1A (3) | |
| Example 14 | I-24A (5) | R-2 (5) | | |
| Example 15 | I-4A (5) | R-2 (5) | | |
| Example 16 | I-4A (7) | R-2 (2) | R-3 (1) | |
| Example 17 | I-4A (9.5) | R-4 (0.5) | | |
| Example 18 | I-4A (9) | R-3 (1) | | |
| Comparative Example 1 | | R-1A (10) | | |
| Comparative Example 2 | | R-2 (5) | R-1A (5) | |
| Comparative Example 3 | | R-2 (5) | R-1M (5) | |
| Comparative Example 4 | | R-2 (2) | R-3 (1) | R-1A (7) |
| Comparative Example 5 | Composition disclosed in Example 1 of JP-A 2007-186570 | | | |
| Comparative Example 6 | | R-2 (2) | R-PA (5) | |
| Comparative Example 7 | | R-2 (2) | R-PM (5) | |
| Comparative Example 8 | Composition 1 disclosed in JP-A 2006-310565 | | | |

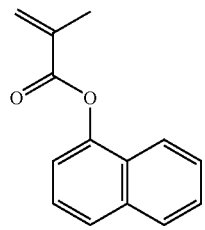

I-1A

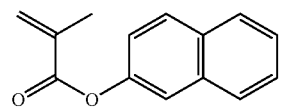

I-2A

I-3A

I-4A

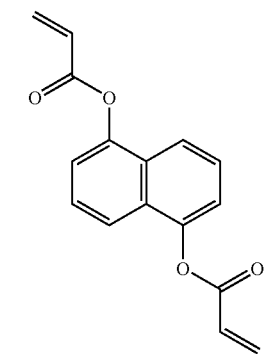

I-1M

I-2M

I-8A

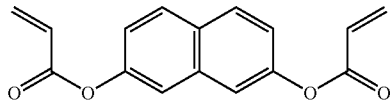

I-9A

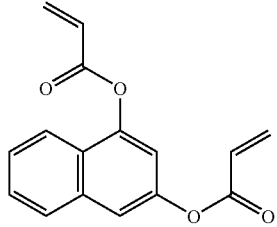

I-10A

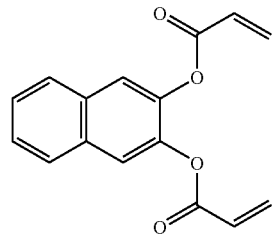

I-11A

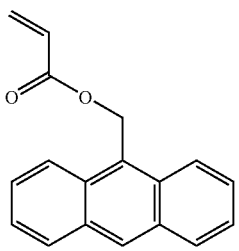

I-16A

-continued

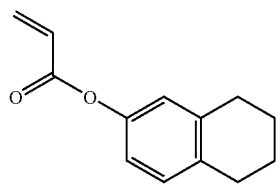

I-24A

<Other Monofunctional Monomers>
R-1A: benzyl acrylate (Biscoat 160, by Osaka Organic Chemical).
R-1M: benzyl methacrylate (Light-Ester BZ, by Kyoeisha Chemical).
R-PA: phenyl acrylate.
R-PM: phenyl methacrylate.
<Other Bifunctional Monomer>
R-2: Neopentyl glycol diacrylate.
<Other Trifunctional or more Polyfunctional Monomers>
R-3: trimethylolpropane triacrylate (Aronix M-309, by To a Gosei).
R-4: dipentaerythritol hexaacrylate (Kayarad DPHA, by Nippon Kayaku).
<Photopolymerization Initiator>
P-1: 2,4,6-trimethylbenzoyl ethoxyphenyl phosphine oxide (Lucirin TPO-L, by BASF).
<Surfactants>
W-1: fluorine-containing surfactant (Tochem Products' fluorine-containing surfactant).
W-2: silicone-type surfactant (Dai-Nippon Ink's Megafac Paintad 31).
<Antioxidants>
A-1: Sumilizer GA80 (by Sumitomo Chemical).
A-2: Adekastab AO503 (by Adeka).
(Evaluation)

The obtained compositions were evaluated as follows.
The results are shown in Table 2 below.
<Dry Etching Resistance>

A resist (nanoimprint composition) was applied onto an Si wafer so that its thickness after cured could be 1 μm, and then, not pressed against a mold, this was exposed to light in a nitrogen atmosphere at a dose of 240 mJ/cm$^2$, thereby forming a cured film. Using Hitachi High-Technology's dry etcher (U-621), this was dry-etched with plasma of a gas of Ar/C$_4$F$_6$/O$_2$=100:4:2 for 2 minutes, and the residual film amount was measured. From the data, the etching rate per second was computed. Thus determined, the etching rate was standardized, based on the value, 1, in Comparative Example 2. The samples of Examples and Comparative Examples were evaluated, as compared with the sample of Comparative Example 2. The samples having a smaller value have better dry etching resistance.
<Test for Solvent Resistance>

Each composition was applied onto a glass substrate in a mode of spin coating, thereby forming a coating film having a thickness of 3.0 μm. Not pressed against a mold, this was exposed to light in a nitrogen atmosphere at a dose of 240 mJ/cm$^2$, and then heated in an oven at 230° C. for 30 minutes thereby forming a cured film. This was dipped in a solvent of N-methylpyrrolidone at 25° C., and before and after dipping, the cured film was checked for the thickness change, as follows. The samples having a smaller film thickness change have better solvent resistance.
A: Thickness change, less than 1%.
B: Thickness change, from 1% to less than 2%.
C: Thickness change, from 2% to less than 10%.
D: Surface roughened.
Evaluation of Mold Releasability
Releasability, 10 μm Each composition was applied onto a glass substrate in a mode of spin coating, thereby forming a coating film having a thickness of 3.0 μm. A mold formed of polydimethylsiloxane (produced by curing Toray Dow Corning's "SILPOT 184" at 80° C. for 60 minutes) having a 10-μm line/space pattern and having a groove thickness of 4.0 μm was put on the coating film formed on the substrate, and set in a nanoimprinting device. The device was degassed in vacuum, and then nitrogen was introduced thereinto for nitrogen purging. The mold was pressed against the substrate under a pressure of 1.5 atmospheres at 25° C., then this was exposed to light under a condition of 240 mJ/cm$^2$ from the back of the mold. After the exposure, the mold was released to give a pattern. After the pattern formation, the mold was checked with a scanning electromicroscope and an optical microscope as to whether or not the composition ingredients were kept remaining thereon. The releasability of the composition from the mold having a 10-μm line/space pattern (releasability, 10 μm) was evaluated as follows.
A: No curable composition remained at all on the mold.
B: Only a little curable composition remained on the mold.
C: Obvious curable composition remained on the mold.
—Releasability, 200 nm—

Each composition was dissolved in propylene glycol monomethyl ether, applied onto a silicon substrate in a mode of spin coating, and heated at 60° C. for 60 seconds thereby forming a coating film having a thickness of 200 nm. A mold of quartz having a 200-nm line/space pattern and having a groove thickness of 200 nm, of which the surface had been processed with fluorine, was put on the coating film, and set in a nanoimprinting device. The device was degassed in vacuum, and then nitrogen was introduced thereinto for nitrogen purging. The mold was pressed against the substrate under a pressure of 1.5 atmospheres at 25° C., then this was exposed to light under a condition of 240 mJ/cm$^2$ from the back of the mold. After the exposure, the mold was released to give a pattern. After the pattern formation, the mold was checked with a scanning electromicroscope and an optical microscope as to whether or not the composition ingredients were kept remaining thereon. The releasability of the composition from the mold having a 200-nm line/space pattern (releasability, 200 nm) was evaluated in the same manner as above.

TABLE 2

|  | Dry etching resistance | Solvent resistance | 10 μm releasability | 200 nm releasability |
| --- | --- | --- | --- | --- |
| Example 1 | 0.59 | A | A | A |
| Example 2 | 0.86 | A | A | A |
| Example 3 | 0.86 | A | A | A |
| Example 4 | 0.86 | A | A | A |
| Example 5 | 0.86 | A | A | A |
| Example 6 | 0.75 | A | A | A |
| Example 7 | 0.80 | A | A | A |
| Example 8 | 0.80 | A | A | A |
| Example 9 | 0.80 | A | A | A |
| Example 10 | 0.79 | A | A | A |
| Example 11 | 0.70 | A | A | A |
| Example 12 | 0.72 | A | A | A |
| Example 13 | 0.80 | A | A | A |
| Example 14 | 0.93 | A | A | A |
| Example 15 | 0.80 | A | A | A |
| Example 16 | 0.70 | A | A | A |
| Example 17 | 0.59 | A | A | A |
| Example 18 | 0.60 | A | A | A |

TABLE 2-continued

| | Dry etching resistance | Solvent resistance | 10 μm releasability | 200 nm releasability |
|---|---|---|---|---|
| Comparative Example 1 | Not cured | Not cured | Not cured | Not cured |
| Comparative Example 2 | 1.00 | B | A | C |
| Comparative Example 3 | 0.99 | B | A | C |
| Comparative Example 4 | 0.90 | C | B | C |
| Comparative Example 5 | 1.10 | C | A | B |
| Comparative Example 6 | 1.01 | B | A | C |
| Comparative Example 7 | 1.00 | B | A | C |
| Comparative Example 8 | 1.10 | C | A | B |

Table 2 confirms that the patterns formed by the use of the curing composition of the invention are all good in point of the dry etching resistance, solvent resistance, the 10-μm releasability and the 200-nm releasability. In Comparative Example 1, benzyl acrylate (compound R-1A) not having a polycyclic aromatic structure was used in place of the compound (I-1A) used in Example 1. The composition of Comparative Example 1 did not cure through photoexposure. Also in Comparative Example 2, benzyl acrylate (compound R-1A) not having a polycyclic aromatic structure was used in place of the polycyclic aromatic structure-having compound in Examples 2 to 4 and 15. The sample in Comparative Example 2 was bad in pint of the etching resistance, the solvent resistance and the 200-nm releasability. In Comparative Example 3, benzyl methacrylate (compound R-1M) not having a polycyclic aromatic structure was used in place of the polycyclic aromatic structure-having compound in Examples 2 to 4 and 15. The sample in Comparative Example 3 was bad in pint of the etching resistance, the solvent resistance and the 200-nm releasability. In Comparative Example 4, benzyl acrylate (compound R-1A) not having a polycyclic aromatic structure was used in place of the compound (I-1A) in Example 6 and the compound (I-4A) in Example 16. The sample in comparative Example 4 was bad in all the evaluations. In Comparative Example 5, the composition of Example 1 in JP-A-2007-186570 was used. This was bad especially in point of the etching resistance and the solvent resistance; and its 200-nm releasability was also relatively bad.

As in the above and as is obvious from the comparison between Example 13 and Comparative Example 2, the patterns of the compositions of Comparative Examples were not good especially in point of the solvent resistance and the 200-nm releasability. The samples of Examples were especially excellent in the mold releasability in formation of nanometer-order patterns.

The present disclosure relates to the subject matter contained in the International Application of PCT/JP2009/52139 filed on Feb. 9, 2009, which is expressly incorporated herein by reference in its entirety. All the publications referred to in the present specification are also expressly incorporated herein by reference in their entirety.

The foregoing description of preferred embodiments of the invention has been presented for purposes of illustration and description, and is not intended to be exhaustive or to limit the invention to the precise form disclosed. The description was selected to best explain the principles of the invention and their practical application to enable others skilled in the art to best utilize the invention in various embodiments and various modifications as are suited to the particular use contemplated. It is intended that the scope of the invention not be limited by the specification, but be defined claims set forth below.

What is claimed is:

1. A curable composition for nanoimprints, comprising a polycyclic aromatic structure-having polymerizable monomer (Ax) and a photopolymerization initiator (B), wherein the polymerizable monomer contains a radical-polymerizable functional group selected from a (meth)acrylate group or an allyl group; or contains a cationic-polymerizable functional group selected from an epoxy group or an oxetane group.

2. The curable composition for nanoimprints according to claim 1, wherein the polycyclic aromatic structure of the polymerizable monomer (Ax) is a hydrocarbon polycyclic aromatic structure.

3. The curable composition for nanoimprints according to claim 1, wherein the polycyclic aromatic structure of the polymerizable monomer (Ax) is a naphthalene structure.

4. The curable composition for nanoimprints according to claim 1, wherein the polymerizable monomer (Ax) contains the radical-polymerizable functional group.

5. The curable composition for nanoimprints according to claim 1, wherein the polymerizable monomer (Ax) is a compound represented by the following formula (I):

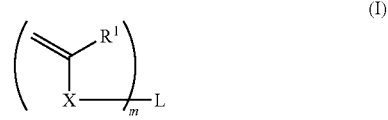

(I)

wherein $R^1$ represents a hydrogen atom, an alkyl group having from 1 to 4 carbon atoms, or a halogen atom; X represents a single bond, or an organic linking group; L represents an m-valent polycyclic aromatic group optionally having a substituent selected from the group consisting of an alkyl group, an aryl group, a halogen atom, an acyloxy group, an alkoxycarbonyl group, a nitro group, a cyano group, and an alkoxy group; and m indicates an integer of from 1 to 3.

6. The curable composition for nanoimprints according to claim 1, wherein the polymerizable monomer (Ax) is a compound represented by the following formula (IA):

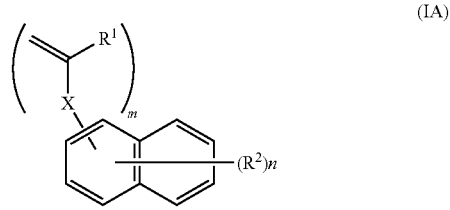

(IA)

wherein $R^1$ represents a hydrogen atom, an alkyl group having from 1 to 4 carbon atoms or a halogen atom; X represents a single bond, or an organic linking group; m indicates an integer of from 1 to 3; $R^2$ represents an organic substituent selected from the group consisting of an alkyl group, an aryl group, a halogen atom, an acyloxy group, an alkoxycarbonyl group, a nitro group, a cyano group, and an alkoxy group; and n indicates an integer of from 0 to 6.

7. The curable composition for nanoimprints according to claim 1, wherein the polymerizable monomer (Ax) is a compound represented by the following formula (IB):

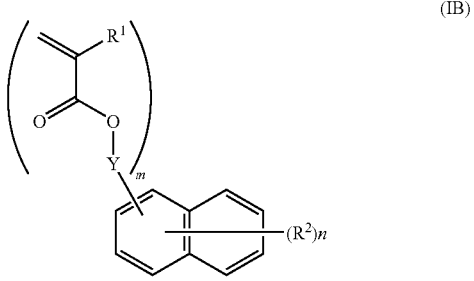

wherein $R^1$ represents a hydrogen atom, an alkyl group having from 1 to 4 carbon atoms, or a halogen atom; Y represents a single bond, or an alkylene group optionally having a hetero atom in the chain; m indicates an integer of from 1 to 3; $R^2$ represents an organic substituent selected from the group consisting of an alkyl group, an aryl group, a halogen atom, an acyloxy group, an alkoxycarbonyl group, a nitro group, a cyano group, and an alkoxy group; and n indicates an integer of from 0 to 6.

8. The curable composition for nanoimprints according to claim 1, wherein the polymerizable monomer (Ax) is a compound represented by the following formula (IC):

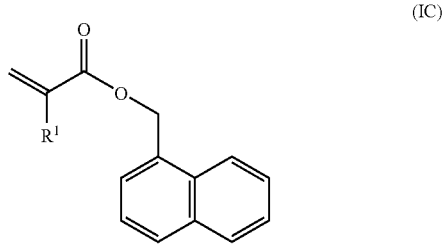

wherein $R^1$ represents a hydrogen atom, an alkyl group having from 1 to 4 carbon atoms, or a halogen atom.

9. The curable composition for nanoimprints according to claim 1, wherein the polymerizable monomer (Ax) is a compound represented by the following formula (ID):

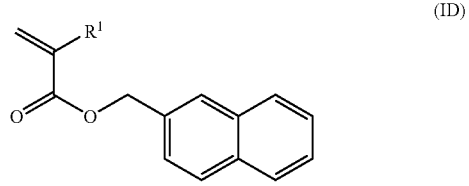

wherein $R^1$ represents a hydrogen atom, an alkyl group having from 1 to 4 carbon atoms, or a halogen atom.

10. The curable composition for nanoimprints according to claim 1, which further comprises any other polymerizable monomer different from the polymerizable monomer (Ax).

11. The curable composition for nanoimprints according to claim 10, which comprises a polymerizable unsaturated monomer having from 1 to 6 ethylenic unsaturated bond as the other polymerizable monomer.

12. The curable composition for nanoimprints according to claim 10, wherein the polymerizable monomers constituting the composition consist of from 20 to 90% by mass of a polymerizable monomer (Ax) having one polymerizable functional group, from 0 to 50% by mass of a polymerizable monomer having one polymerizable functional group except the polymerizable monomer (Ax), from 10 to 50% by mass of a polymerizable monomer having 2 or 3 polymerizable functional groups except the polymerizable monomer (Ax), and from 0 to 30% by mass of a polymerizable monomer having 4 or more polymerizable functional groups except the polymerizable monomer (Ax).

13. The curable composition for nanoimprints according to claim 10, wherein the polymerizable monomers constituting the composition consist of from 40 to 80% by mass of a polymerizable monomer (Ax) having one polymerizable functional group, from 0 to 40% by mass of a polymerizable monomer having one polymerizable functional group except the polymerizable monomer (Ax), from 20 to 50% by mass of a polymerizable monomer having 2 or 3 polymerizable functional groups except the polymerizable monomer (Ax), and from 0 to 10% by mass of a polymerizable monomer having 4 or more polymerizable functional groups except the polymerizable monomer (Ax).

14. The curable composition for nanoimprints according to claim 1, which comprises a polymer ingredient having a molecular weight of at least 2000 in an amount of at most 30% by mass, relative to the whole weight of the ingredients constituting the composition except solvents.

15. The curable composition for nanoimprints according to claim 1, wherein the total amount of polymerizable monomers having an acrylate group is from 90 to 100% by mass, relative to the whole weight of the polymerizable monomers constituting the composition.

16. The curable composition for nanoimprints according to claim 1, which further comprises at least one surfactant selected from the group consisting of fluorine-containing surfactants, silicone surfactants and fluorine-containing silicone surfactants.

17. The curable composition for nanoimprints according to claim 1, which further comprises at least one antioxidant selected from the group consisting of hindered phenol antioxidants and thioether antioxidants.

18. The curable composition for nanoimprints according to claim 1, which further comprises at least one solvent selected from the group consisting of propylene glycol monomethyl ether acetate, cyclohexanone, 2-heptanone, gamma-butyrolactone, propylene glycol monomethyl ether, and ethyl lactate.

19. A patterning method comprising:
applying a curable composition according to claim 1 onto a substrate to form a patterning layer thereon
pressing a mold against the surface of the patterning layer, and
irradiating the patterning layer with light.

20. A curable composition for nanoimprints, comprising a polycyclic aromatic structure-having polymerizable monomer (Ax) and a photopolymerization initiator (B), wherein the polymerizable monomer (Ax) is a compound represented by the following formula (I):

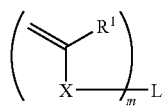

wherein R¹ represents a hydrogen atom, an alkyl group having from 1 to 4 carbon atoms, or a halogen atom; X represents —O—, —C(=O)O—, —C(=O)NRx- in which Rx represents a hydrogen atom or an organic group, an alkylene group, or a linking group of two or more such groups as combined; L represents an m-valent polycyclic aromatic group optionally having an alkyl group, an aryl group, a halogen atom, an acyloxy group, an alkoxycarbonyl group, a nitro group, a cyano group or an alkoxy group; and m indicates an integer from 1 to 3.

21. The curable composition for nanoimprints according to claim 20, wherein the polymerizable monomer (Ax) is a compound represented by the following formula (IA):

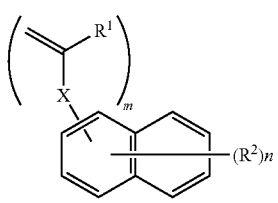

wherein R¹ represents a hydrogen atom, an alkyl group having from 1 to 4 carbon atoms, or a halogen atom; X represents —O—, —C(=O)O—, —C(=O)NR$_x$ in which R$_x$ represents a hydrogen atom or an organic group, an alkylene group, or a linking group of two or more such groups combined; R² represents an organic substituent selected from the group consisting of an alkyl group, an aryl group, a halogen atom, an acyloxy group, an alkoxycarbonyl group, a nitro group, a cyano group, and an alkoxy group; and n indicates an integer of from 0 to 6.

22. The curable composition for nanoimprints according to claim 20, which further comprises any other polymerizable monomer different from the polymerizable monomer (Ax).

23. The curable composition for nanoimprints according to claim 22, which comprises a polymerizable unsaturated monomer having from 1 to 6 ethylenic unsaturated bond as the other polymerizable monomer.

24. The curable composition for nanoimprints according to claim 22, wherein the polymerizable monomers constituting the composition consist of from 20 to 90% by mass of a polymerizable monomer (Ax) having one polymerizable functional group, from 0 to 50% by mass of a polymerizable monomer having one polymerizable functional group except the polymerizable monomer (Ax), from 10 to 50% by mass of a polymerizable monomer having 2 or 3 polymerizable functional groups except the polymerizable monomer (Ax), and from 0 to 30% by mass of a polymerizable monomer having 4 or more polymerizable functional groups except the polymerizable monomer (Ax).

25. The curable composition for nanoimprints according to claim 22, wherein the polymerizable monomers constituting the composition consist of from 40 to 80% by mass of a polymerizable monomer (Ax) having one polymerizable functional group, from 0 to 40% by mass of a polymerizable monomer having one polymerizable functional group except the polymerizable monomer (Ax), from 20 to 50% by mass of a polymerizable monomer having 2 or 3 polymerizable functional groups except the polymerizable monomer (Ax), and from 0 to 10% by mass of a polymerizable monomer having 4 or more polymerizable functional groups except the polymerizable monomer (Ax).

26. The curable composition for nanoimprints according to claim 20, which comprises a polymer ingredient having a molecular weight of at least 2000 in an amount of at most 30% by mass, relative to the whole weight of the ingredients constituting the composition except solvents.

27. The curable composition for nanoimprints according to claim 20, wherein the total amount of polymerizable monomers having an acrylate group is from 90 to 100% by mass, relative to the whole weight of the polymerizable monomers constituting the composition.

28. The curable composition for nanoimprints according to claim 20, which further comprises at least one surfactant selected from the group consisting of fluorine-containing surfactants, silicone-type surfactants and fluorine-containing silicone-type surfactants.

29. The curable composition for nanoimprints according to claim 20, which further comprises at least one antioxidant selected from the group consisting of hindered phenol antioxidants and thioether antioxidants.

30. The curable composition for nanoimprints according to claim 20, which further comprises at least one solvent selected from the group consisting of propylene glycol monomethyl ether acetate, cyclohexanone, 2-heptanone, gamma-butyrolactone, propylene glycol monomethyl ether, and ethyl lactate.

31. A curable composition for nanoimprints, comprising a polycyclic aromatic structure-having polymerizable monomer (Ax) and a photopolymerization initiator (B), wherein the polymerizable monomer contains a cationic-polymerizable functional group selected from an epoxy group or an oxetane group; or a radical-polymerizable functional group selected from a vinyl group, (meth)acrylate group or an allyl group, and wherein the polycyclic aromatic structure is selected from anthracene, phenanthrene, pyrene, indole, quinoline or benzisoquinoline.

32. The curable composition for nanoimprints according to claim 31, wherein the polymerizable monomer (Ax) is a compound represented by the following formula (IA):

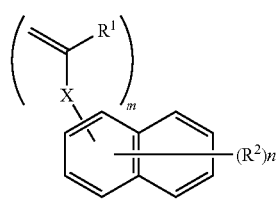

wherein R¹ represents a hydrogen atom, an alkyl group having from 1 to 4 carbon atoms, or a halogen atom; X represents a single bond, or an organic linking group; m indicates an integer of from 1 to 3; R² represents an organic substituent selected from the group consisting of an alkyl group, an aryl group, a halogen atom, an acyloxy group, an alkoxycarbonyl group, a nitro group, a cyano group, and an alkoxy group; and n indicates an integer of from 0 to 6.

33. The curable composition for nanoimprints according to claim 31, which further comprises any other polymerizable monomer different from the polymerizable monomer (Ax).

34. The curable composition for nanoimprints according to claim 33, which comprises a polymerizable unsaturated monomer having from 1 to 6 ethylenic unsaturated bond as the other polymerizable monomer.

35. The curable composition for nanoimprints according to claim 33, wherein the polymerizable monomers constituting the composition consist of from 20 to 90% by mass of a polymerizable monomer (Ax) having one polymerizable functional group, from 0 to 50% by mass of a polymerizable monomer having one polymerizable functional group except the polymerizable monomer (Ax), from 10 to 50% by mass of a polymerizable monomer having 2 or 3 polymerizable functional groups except the polymerizable monomer (Ax), and from 0 to 30% by mass of a polymerizable monomer having 4 or more polymerizable functional groups except the polymerizable monomer (Ax).

36. The curable composition for nanoimprints according to claim 33, wherein the polymerizable monomers constituting the composition consist of from 40 to 80% by mass of a polymerizable monomer (Ax) having one polymerizable functional group, from 0 to 40% by mass of a polymerizable monomer having one polymerizable functional group except the polymerizable monomer (Ax), from 20 to 50% by mass of a polymerizable monomer having 2 or 3 polymerizable functional groups except the polymerizable monomer (Ax), and from 0 to 10% by mass of a polymerizable monomer having 4 or more polymerizable functional groups except the polymerizable monomer (Ax).

37. The curable composition for nanoimprints according to claim 31, which comprises a polymer ingredient having a molecular weight of at least 2000 in an amount of at most 30% by mass, relative to the whole weight of the ingredients constituting the composition except solvents.

38. The curable composition for nanoimprints according to claim 31, wherein the total amount of polymerizable monomers having an acrylate group is from 90 to 100% by mass, relative to the whole weight of the polymerizable monomers constituting the composition.

39. The curable composition for nanoimprints according to claim 31, which further comprises at least one surfactant selected from the group consisting of fluorine-containing surfactants, silicone surfactants and fluorine-containing silicone surfactants.

40. The curable composition for nanoimprints according to claim 31, which further comprises at least one antioxidant selected from the group consisting of hindered phenol antioxidants and thioether antioxidants.

41. The curable composition for nanoimprints according to claim 31, which further comprises at least one solvent selected from the group consisting of propylene glycol monomethyl ether acetate, cyclohexanone, 2-heptanone, gamma-butyrolactone, propylene glycol monomethyl ether, and ethyl lactate.

* * * * *